(12) United States Patent
Sasaki et al.

(10) Patent No.: US 7,723,753 B2
(45) Date of Patent: May 25, 2010

(54) SEMICONDUCTOR DEVICE AND MANUFACTURING METHOD OF THE SAME

(75) Inventors: Kenji Sasaki, Tokyo (JP); Ikuro Akazawa, Tokyo (JP); Yoshinori Imamura, Tokyo (JP); Atsushi Kurokawa, Tokyo (JP); Tatsuhiko Ikeda, Tokyo (JP); Hiroshi Inagawa, Tokyo (JP); Yasunari Umemoto, Tokyo (JP); Isao Obu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 69 days.

(21) Appl. No.: 11/962,169

(22) Filed: Dec. 21, 2007

(65) Prior Publication Data

US 2008/0224174 A1    Sep. 18, 2008

(30) Foreign Application Priority Data

Mar. 13, 2007    (JP)    ............................. 2007-062740

(51) Int. Cl.
*H01L 27/082* (2006.01)
*H01L 21/331* (2006.01)

(52) U.S. Cl. ............... 257/197; 257/499; 257/E21.371; 438/235; 438/423

(58) Field of Classification Search ........................ None
See application file for complete search history.

(56) References Cited

U.S. PATENT DOCUMENTS 5,943,591 A * 8/1999 Vokoun et al. ............... 438/462
6,831,345 B2    12/2004 Kinoshita et al.
6,844,592 B2    1/2005 Yamaguchi et al.
6,903,388 B2 *  6/2005 Murayama et al. .......... 257/197
2005/0258452 A1* 11/2005 Konishi et al. .............. 257/197
2006/0118970 A1*  6/2006 Ida et al. ..................... 257/782
2007/0138596 A1  6/2007 Kitamura et al.

FOREIGN PATENT DOCUMENTS

| JP | 1995-201855 A | 8/1995 |
| JP | 1997-283754 | 10/1997 |
| JP | 1999-102917 A | 4/1999 |
| JP | 2003-101039 A | 4/2003 |
| JP | 2003-273355 A | 9/2003 |
| JP | 2004-158603 A | 6/2004 |
| JP | 2005-203548 A | 7/2005 |

* cited by examiner

*Primary Examiner*—Thanh V Pham
*Assistant Examiner*—Andres Munoz
(74) *Attorney, Agent, or Firm*—Mattingly & Malur, P.C.

(57) ABSTRACT

In a GaAs substrate as a semi-insulating substrate, a heterojunction bipolar transistor (HBT) is formed in an element formation region, while an isolation region is formed in an insulating region. The isolation region formed in the insulating region is formed by introducing helium into the same semiconductor layers as the sub-collector semiconductor layer and collector semiconductor layer of the HBT. In an outer peripheral region, a conductive layer is formed to be exposed from protective films and coupled to a back surface electrode. Because a GND potential is supplied to the back surface electrode, the conductive layer is fixed to the GND potential. The conductive layer is formed of the same semiconductor layers as the sub-collector semiconductor layer and collector semiconductor layer of the HBT.

16 Claims, 19 Drawing Sheets

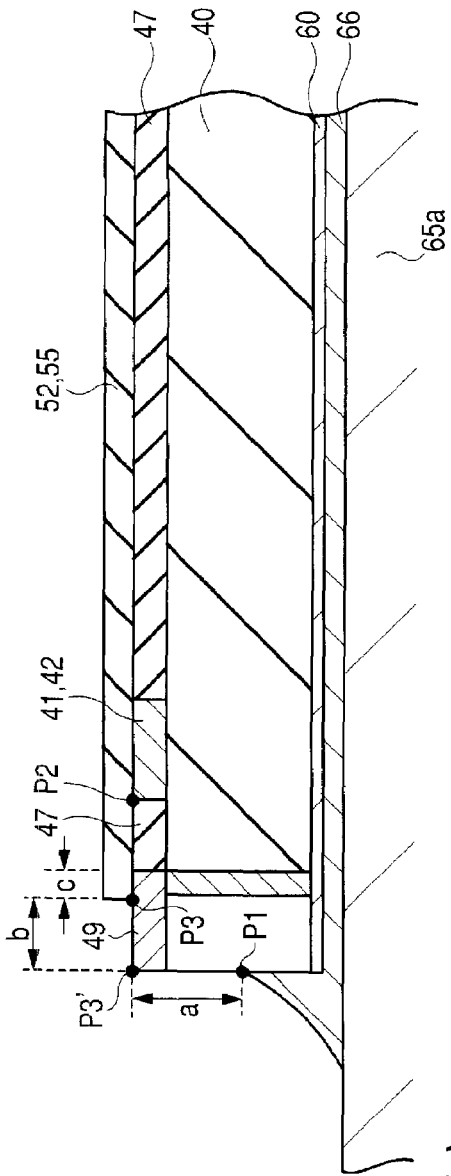
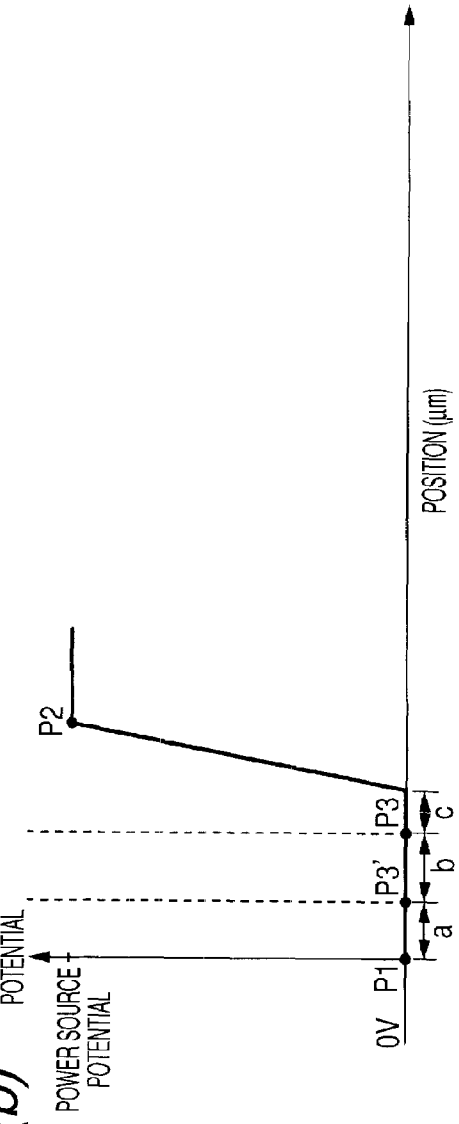
FIG. 10(a)
FIG. 10(b)

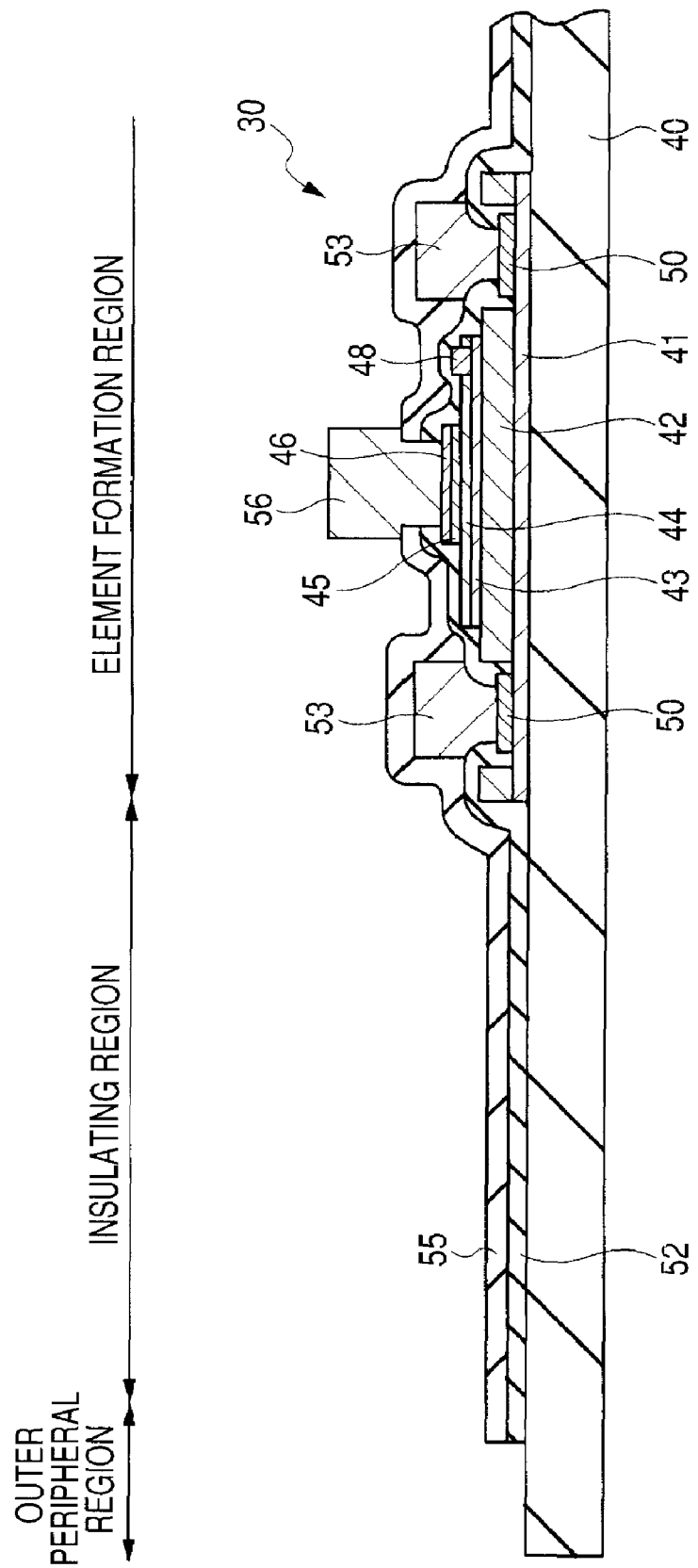

SEMICONDUCTOR DEVICE AND MANUFACTURING METHOD OF THE SAME

CROSS-REFERENCE TO RELATED APPLICATIONS

The disclosure of Japanese Patent Application No. 2007-62740 filed on Mar. 13, 2007 including the specification, drawings and abstract is incorporated herein by reference in its entirety.

BACKGROUND OF THE INVENTION

The present invention relates to a semiconductor device and a technology for manufacturing the same and, more particularly, to a technology which is effective when applied to a semiconductor device in which a transistor is formed on a compound semiconductor substrate and to a technology for manufacturing the same.

Japanese Unexamined Patent Publication No. 2003-273355 (Patent Document 1) discloses a technology which forms a field stopper layer ($n^+$-type channel stopper layer) for stopping depletion in the peripheral edge portion of a semiconductor chip and forms an electrode on the field stopper layer.

Japanese Unexamined Patent Publication No. Hei 11(1999)-102917 (Patent Document 2) discloses a technology which forms a channel stopper region composed of a shallow n-type diffusion layer in the surface region of an $n^-$-type epitaxial layer along the outer edge of a substrate and forms a channel stopper electrode over the channel stop region.

Japanese Unexamined Patent Publication No. 2003-101039 (Patent Document 3) discloses a technology which forms a channel stopper region composed of an $n^+$-type heavily doped impurity layer in the peripheral edge portion of a semiconductor chip. On the channel stopper layer, a third electrode is provided to be electrically coupled to a second electrode formed on the back surface of the semiconductor chip. It is stated that, with the channel stopper region, it is possible to prevent the channel from expanding out of an element. It is also stated that the channel stopper region which is electrically coupled to the third electrode is provided to fix the surface potential of a semiconductor substrate and has the effect of preventing the degradation of breakdown voltage when a depletion layer reaches the channel stopper region. It is stated herein that the $n^+$-type impurity in the channel stopper region may also be a $p^+$-type impurity.

Japanese Unexamined Patent Publication No. 2004-158603 (Patent Document 4) discloses a technology which provides a $p^+$-type channel stopper region in the element peripheral portion of a semiconductor chip and forms an electrode in the $p^+$-type channel stopper region.

Japanese Unexamined Patent Publication No. Hei 9 (1997)-283754 (Patent Document 5) discloses a technology which forms a low-resistance n-type end portion layer in the surface of an n-type base layer in the outer terminal portion of a junction termination region to surround a trench. In addition, a ring-shaped end portion electrode is disposed to come in contact with the n-type end portion layer. It is stated that the surface of the junction termination region between a cathode electrode and the ring-shaped end portion electrode is covered with a thick insulating layer.

Japanese Unexamined Patent Publication No. 2005-203548 (Patent Document 6) discloses a technology which forms a diffusion layer as a guard ring portion in the peripheral edge portion of a semiconductor chip.

Japanese Unexamined Patent Publication No. Hei 07 (1995)-201855 (Patent Document 7) discloses a technology pertaining to a semiconductor device having a long and thin conductor film such as a guard ring used to improve, e.g., moisture resistance in the region between the peripheral edge portion of a semiconductor chip and wiring pads. The publication discloses the technology which reduces an external stress causing a crack in the guard ring in the mold encapsulation of the semiconductor chip and lessens characteristic failures resulting from the crack to allow an improvement in moisture resistance. It is stated that, specifically, the guard ring composed of a conductive film and provided in the region between the peripheral edge portion of the semiconductor chip and the wiring pads is formed in a meandering or curved pattern.

[Patent Document 1]
Japanese Unexamined Patent Publication No. 2006-273355
[Patent Document 2]
Japanese Unexamined Patent Publication No. Hei 11(1999)-102917
[Patent Document 3]
Japanese Unexamined Patent Publication No. 2003-101039
[Patent Document 4]
Japanese Unexamined Patent Publication No. 2004-158603
[Patent Document 5]
Japanese Unexamined Patent Publication No. Hei 09 (1997)-283754
[Patent Document 6]
Japanese Unexamined Patent Publication No. 2005-203548
[Patent Document 7]
Japanese Unexamined Patent Publication No. Hei 07 (1995)-201855

SUMMARY OF THE INVENTION

For example, there is a semiconductor element using a group III-V compound semiconductor such as gallium arsenide (GaAs). The compound semiconductor has a characteristic feature of being higher in mobility than silicon (Si) and allowing a semi-insulating crystal to be obtained. The compound semiconductor also allows the production of a mixed crystal and the formation of a heterojunction.

As a semiconductor element using a heterojunction, there is a heterojunction bipolar transistor (hereinafter referred to as the HBT). The HBT is a bipolar transistor using gallium arsenide for a base layer and using indium gallium phosphide (InGaP), aluminum gallium arsenide (AlGaAs), or the like for an emitter layer. That is, the HBT is the bipolar transistor in which a heterojunction is formed using different semiconductor materials for the base layer and the emitter layer.

The heterojunction allows the forbidden bandwidth of the emitter in the base-emitter junction to be larger than that of the base. As a result, carriers injected from the emitter into the base can be significantly increased compared with carriers of opposite charge from the base into the emitter. Therefore, the HBT has the characteristic feature of an extremely large current amplification factor.

Since the current amplification factor of the HBT is extremely large as described above, the HBT is used in, e.g., a power amplifier (RF (Radio Frequency) module) mounted in a cellular phone set. In the RF module, a semiconductor chip formed with HBTs is mounted on a wiring board.

FIG. 27 is a cross-sectional view showing the semiconductor chip formed with the HBTs. As shown in FIG. 27, a sub-collector semiconductor layer 101 is formed on a GaAs substrate 100 as a semi-insulating substrate in an element formation region. On the sub-collector semiconductor layer 101, a collector semiconductor layer 102 are formed. The sub-collector semiconductor layer 101 is formed of an n$^+$-type GaAs layer and the collector semiconductor layer 102 is formed of an n$^-$-type GaAs layer. In the collector semiconductor layer 102, openings are provided and collector electrodes 103 are formed on the sub-collector semiconductor layer 101 exposed from the opening. The collector electrodes 103 are electrically coupled to collector wires 104.

On the collector semiconductor layer 102, a base semiconductor layer 105 is formed. A base electrode 106 is formed to be coupled to the base semiconductor layer 105. The base semiconductor layer 105 is formed of a p$^+$ type GaAs layer. On the base semiconductor layer 105, an emitter semiconductor layer 107 is formed and a GaAs layer 108 is formed on the emitter semiconductor layer 107. On the GaAs layer 108, an emitter electrode 109 is formed and an emitter wire 110 is electrically coupled onto the emitter electrode 109. The emitter semiconductor layer 107 is formed of an n$^-$-type InGaP layer. In this manner, the HBT is formed in the element formation region.

From an insulating region adjacent to the element formation region over to the outer peripheral region of the semiconductor chip, an isolation region 111 is formed. The isolation region 111 utilizes layers which are the sub-collector semiconductor layer 101 and the collector semiconductor layer 102 each formed in the element formation region over and extending over to the insulating region. The isolation region 111 is formed by introducing helium as a non-metal element into the extending sub-collector semiconductor layer 101 and collector semiconductor layer 102. The isolation region 111 is formed over to the outer peripheral region of the semiconductor chip. In the element formation region, the HBT is formed, while the isolation region 111 is formed in the insulating region and the outer peripheral region. Over the HBT and the isolation region 111, a protective film 112 and a protective film 113 are formed. The protective films 112 and 113 are not formed over to the end portion of the outer peripheral region so that, in the vicinity of the end portion of the outer peripheral region, the isolation region 111 formed as a layer underlying the protective films 112 and 113 is exposed. The protective films 112 and 113 are not formed over to the terminal portion of the outer peripheral region because dicing is performed in a region in the vicinity of the terminal portion of the outer peripheral region. To facilitate dicing, the protective films 112 and 113 are not formed in the region.

Since the semiconductor chip thus constructed is mounted in, e.g., the power amplifier of a cellular phone, reliability characteristics are required thereof. Moisture resistance is one of the required reliability characteristics. The moisture resistance indicates resistance to moisture and an impurity which enter the semiconductor chip and cause a faulty operation in the HBT or the like formed in the semiconductor chip. To guarantee the moisture resistance, a moisture resistance test is performed with respect to the semiconductor chip. As a moisture resistance test, there is one which holds the semiconductor chip in a condition where a temperature and a humidity are set to given values for a specified time and then verifies no entrance of an impurity into the semiconductor chip after the lapse of the specified time. For example, there is a method which holds the semiconductor chip in a condition where the temperature is set to 130° C. and the humidity is set to 85% for a specified time. At this time, when the HBT formed in the semiconductor chip is not operated, there is no entrance of an impurity from between the isolation region 111 and the protective film 112 each located in the outer peripheral region shown in FIG. 27. However, when the HBT formed in the semiconductor chip is operated, the isolation region 111 located in the outer peripheral region degenerates so that a gap is formed between the isolation region 111 and the protective film 111. From the gap, an impurity enters the semiconductor chip, which is the problem newly found by the present inventors. That is, when the moisture resistance test is performed in a state where a voltage is applied to the HBT formed in the semiconductor chip or the like, the isolation region 111 located in the outer peripheral region degenerates. This causes the deterioration of the adhesion between the degenerated isolation region 111 and the protective film 112 in the outer peripheral region and the formation of the gap therebetween. As a result, it has been found that an impurity enters the semiconductor chip from the gap.

An object of the present invention is to provide a technology which allows an improvement in the moisture resistance of a semiconductor device.

The above and other objects and novel features of the present invention will become apparent from the description of the present specification and the accompanying drawings.

As shown below, a-brief description will be given to the outline of the representative aspects of the present invention disclosed in the present application.

A semiconductor device according to the present invention has a semiconductor chip, and the semiconductor chip has: (a) a semi-insulating substrate; (b) a plurality of transistors formed in the semi-insulating substrate; and (c) an isolation region which is an insulating region for isolating the plurality of transistors from each other and formed by implanting a non-metal element into a semiconductor layer. The semiconductor chip also has: (d) a conductive layer formed in an outer peripheral portion of the semiconductor chip; and (e) a protective film covering the plurality of transistors. In the semiconductor device, an end portion of the protective film is located over the conductive layer to expose a part of the conductive layer, and a potential of the conductive layer is set to a reference potential.

A method of manufacturing a semiconductor device according to the present invention comprises the steps of: (a) preparing a semi-insulating substrate in a state of a wafer; (b) forming a sub-collector semiconductor layer over a principal surface of the semi-insulating substrate; (c) forming a collector semiconductor layer over the sub-collector semiconductor layer; and (d) forming a base semiconductor layer over the collector semiconductor layer. The method of manufacturing a semiconductor device also comprises the steps of: (e) forming an emitter semiconductor layer over the base semiconductor layer; (f) processing the emitter semiconductor layer to form an emitter electrode over the emitter semiconductor layer in a transistor formation region; and (g) introducing a non-metal element into the base semiconductor layer, the collector semiconductor layer, and the sub-collector semiconductor layer which are formed in an isolation formation region for isolating the transistor formation region to form an isolation region. The method of manufacturing a semiconductor device further comprises the step of: (h) removing the base semiconductor layer formed in the isolation region, while processing the base semiconductor layer formed in the transistor formation region and forming a base electrode over the processed base semiconductor layer. Subsequently, the method of manufacturing a semiconductor device comprises the step of: (i) providing a first trench in the collector semiconductor layer formed in the transistor formation region, while providing a second trench in the collector semiconductor layer which is isolated from the collector semiconductor layer formed in the transistor formation region by the isolation region and is formed in an outer peripheral portion of a chip region. Next, the method of manufacturing a semiconductor device comprises the step of: (j) forming a collector electrode in the first trench formed in the transistor formation region to couple the collector electrode to the sub-collector semiconductor layer formed in the transistor formation region, while forming an ohmic contact portion in the second trench formed in the outer peripheral portion of the chip region to couple the ohmic contact portion to the sub-collector semiconductor layer formed in the outer peripheral portion of the chip region. The method of manufacturing a semiconductor device further comprises the step of: (k) forming a collector wire coupling to the collector electrode, while forming a wire coupled to the ohmic contact portion to reach a position over a part of the isolation region. Thereafter, the method of manufacturing a semiconductor device comprises the step of: (l) forming a protective film over the semi-insulating substrate, while removing the protective film from a part of the outer peripheral portion of the chip region to locate an end portion of the protective film over the collector semiconductor layer formed in the outer peripheral portion of the chip region and expose a part of the collector semiconductor layer formed in the outer peripheral portion of the chip region. Subsequently, the method of manufacturing a semiconductor device comprises the steps of: (m) processing the protective film to form an emitter wire coupling to the emitter electrode in the transistor formation region; and (n) forming a hole extending from a surface of the semi-insulating substrate opposite to a principal surface thereof through the semi-insulating substrate and the isolation region and reaching the wire. Subsequently, the method of manufacturing a semiconductor device comprises the step of: (o) forming a back surface electrode over the surface of the semi-insulating substrate opposite to the principal surface thereof and including an inside of the hole. In the method of manufacturing a semiconductor device, a potential of a conductive layer coupled to the back surface electrode via the wire and the ohmic contact portion and comprising the collector semiconductor layer and the sub-collector semiconductor layer which are formed in the outer peripheral portion of the chip region is set to a reference potential.

The following is the brief description of effects achievable by the representative aspects of the invention disclosed in the present application.

Since the semiconductor layer exposed from the protective films is formed in the outer peripheral portion of the semi-insulating substrate composing the semiconductor chip and the potential of the semiconductive layer is set to the reference potential (GND potential), it is possible to prevent the degeneration of the semiconductor layer formed in the outer peripheral portion and prevent the entrance of an impurity into the semiconductor chip from between the semiconductive layer and the protection films.

BRIEF DESCRIPTION OF THE DRAWINGS

FIG. 10A is a schematic cross-sectional view of a semiconductor chip in a first embodiment of the present invention and FIG. 10B is a graph showing the potential at specified positions in the semiconductor chip;

FIG. 11 is a cross-sectional view examined by the present inventors and showing a mesa isolation structure;

DETAILED DESCRIPTION OF THE PREFERRED EMBODIMENTS

Figure 1:
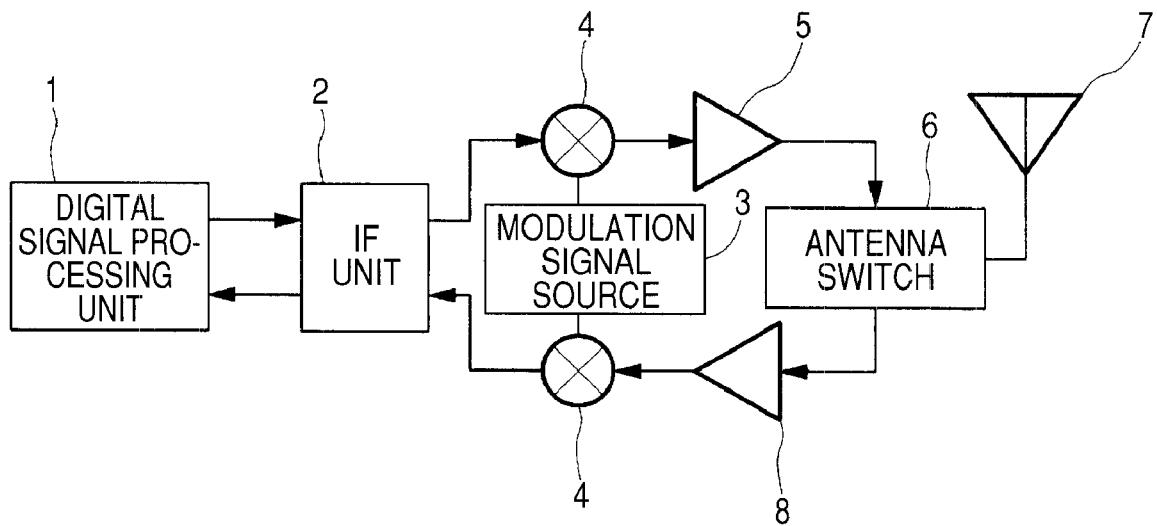
FIG. 1 is a view showing a block diagram of a signal transmitting/receiving unit in a digital cellular phone.

A description will be given herein below to the present invention by dividing it, if necessary, into a plurality of sections or embodiments for the sake of convenience. However, they are by no means irrelevant to each other unless shown particularly explicitly and are mutually related to each other such that one of the sections or embodiments is a variation or a detailed or complementary description of some or all of the others.

If the number and the like of elements (including the number, numerical value, amount, and range thereof) are referred to in the following embodiments, they are not limited to specific numbers unless shown particularly explicitly or unless they are obviously limited to specific numbers in principle. The number and the like of the elements may be not less than or not more than specific numbers.

It will easily be appreciated that, in the following embodiments, the components thereof (including also elements and steps) are not necessarily indispensable unless shown particularly explicitly or unless the components are considered to be obviously indispensable in principle.

Likewise, if the configurations, positional relationship, and the like of the components are referred to in the following embodiments, the configurations and the like are assumed to include those substantially proximate or similar thereto unless shown particularly explicitly or unless obviously they are not in principle. The same shall apply to the foregoing numeric value and the range.

Throughout the drawings for illustrating the embodiments of the present invention, the same parts are designated by the same reference numerals in principle and a repeated description thereof will be omitted. There are cases where even plan views may be hatched for easy viewing of the drawings.

First Embodiment

FIG. 1 is a block diagram of a signal transmitting/receiving unit in, e.g., a digital cellular phone set. In FIG. 1, the signal transmitting/receiving unit of the cellular phone set has a digital signal processing unit 1, IF (Intermediate Frequency) unit 2, a modulated signal source 3, a mixer 4, a RF module 5, an antenna switch 6, an antenna 7, and a low-noise amplifier 8.

The digital signal processing unit 1 is adapted to be capable of digital processing of an analog signal such as an audio signal to generate a baseband signal. The IF unit 2 is adapted to be capable of converting the baseband signal generated in the digital signal processing unit 1 to an intermediate-frequency signal.

The modulated signal source 3 is a circuit which allows a modulated signal to be obtained using a reference oscillator such as a quartz oscillator having a stable frequency. The mixer 4 is a frequency converter for converting a frequency.

The RF module 5 is a circuit for newly generating a high-power signal similar to an extremely weak input signal with power supplied from a power source and outputting the high-power signal.

The antenna switch 6 is for separating the input signal inputted to the digital cellular phone set from an output signal outputted from the digital cellular phone set.

The antenna 7 is for transmitting and receiving a radio wave. The low-noise amplifier 8 is for amplifying a signal received by the antenna 7.

The digital cellular phone set is thus constructed. A brief description will be given hereinbelow to the operation of the digital cellular phone set. First, the description will be given to the case of transmitting a signal. The baseband signal generated by the digital processing of an analog signal such as an audio signal in the digital signal processing unit 1 is converted to the IF signal in the IF unit 2. Subsequently, the IF signal is converted to a RF (radio frequency) signal by the modulated signal source 3 and the mixer 4. The signal converted to the RF signal is inputted to the RF module 5. The RF signal inputted to the RF module 5 is amplified therein and transmitted from the antenna 7 via the antenna switch 6.

Next, the description will be given to the case of receiving the signal. The RF signal received by the antenna 7 is amplified by the low-noise amplifier 8. Subsequently, the signal amplified by the low-noise amplifier 8 is converted to the IF signal by the modulated signal source 3 and the mixer 4 and then inputted to the IF unit 2. In the IF unit 2, the IF signal is detected and the baseband signal is extracted. Thereafter, the baseband signal is processed in the digital signal processing unit 1 and the audio signal is outputted therefrom.

As described above, when the signal is transmitted from the digital cellular phone set, the signal is amplified by the RF module 5. Next, a description will be given to a structure of the RF module 5.

Figure 2:
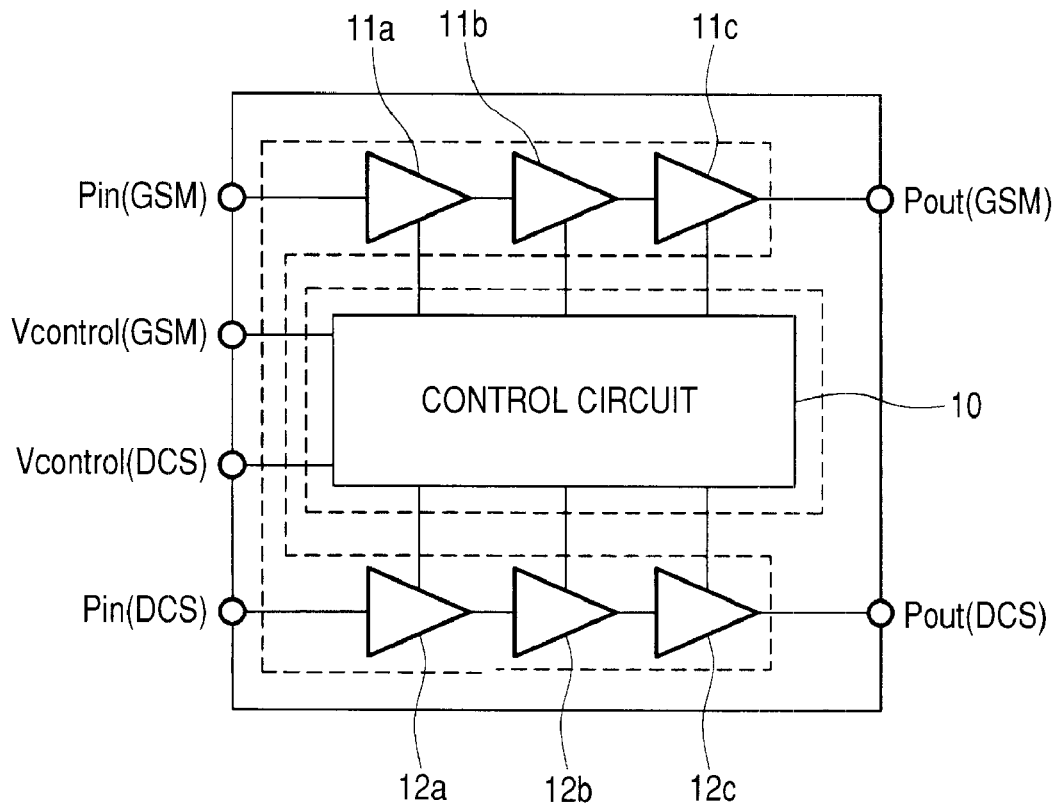
FIG. 2 is a circuit block diagram of a RF amplifying circuit in a RF module.

FIG. 2 shows the circuit blocks of a RF amplifying circuit in the RF module according to the first embodiment. Referring to FIG. 2, the circuit blocks of the RF amplifying circuit will be described. In FIG. 2, the RF amplifying circuit has a control circuit 10, amplifying portions 11a to 11c, and amplifying portions 12a to 12c. The RF amplifying circuit is adapted to be capable of amplifying signals in two frequency bands. That is, on one hand, a signal using the frequency band of 880 MHz to 915 MHz can be amplified in accordance with a GSM (Global System for Mobile Communication) method using the first frequency. On the other hand, a signal using the frequency band of 1710 MHz to 1785 MHz can be amplified in accordance with a DCS (Digital Communication system 1800) method using the second frequency.

The control circuit 10 present in the RF amplifying circuit described above is constructed to receive control signals and control each of the amplifying portions 11a to 11c and the amplifying portions 12a to 12c based on the control signal received thereby. To the control circuit 10, a control signal (Vcontrol (GSM)) for controlling the amplifying portions 11a to 11c and a control signal (Vcontrol (DCS) for controlling the amplifying portions 12a to 12c can be inputted individually. The control circuit 10 performs a control operation based on the Vcontrol (GSM) in the case of using the amplifying portions 11a to 11c, while performing a control operation based on the Vcontrol (DCS) in the case of using the amplifying portions 12a to 12c. In this manner, the RF amplifying circuit according to the first embodiment controls the amplification of the signals in the two frequency bands. The control circuit 10 is composed of, e.g., a MOSFET (Metal Oxide Semiconductor Field Effect Transistor) and the like.

The amplifying portions 11a to 11c (first circuit) are constructed to receive an input power (input signal) Pin (GSM) according to the GSM method and amplify the input power Pin (GSM) in three stages. That is, the input power Pin (GSM) is first amplified in the amplifying portion 11a and then the power amplified in the amplifying portion 11a is amplified in the amplifying portion 11b. The power amplified in the amplifying portion 11b is further amplified in the amplifying portion 11c in the final stage and, thereafter, outputted as an output signal from the RF amplifying circuit. In this manner, the amplification of the power in accordance with the GSM method can be performed in the amplifying portions 11a to 11c.

Likewise, the amplifying portions 12a to 12c (second circuit) are constructed to receive an input power (input signal) Pin (DCS) according to the DCS method and amplify the input power Pin (DCS) in three stages. That is, the input power Pin (DCS) is amplified in the amplifying portion 12a and then the power amplified in the amplifying portion 12a is amplified in the amplifying portion 12b. The power amplified in the amplifying portion 12b is further amplified in the amplifying portion 12c and then outputted as the output signal from the RF amplifying circuit. In this manner, the amplification of the power in accordance with the DCS method can be performed in the amplifying portions 12a to 12c.

Each of the amplifying portions 12a to 12c is also composed of, e.g., a HBT having a large current amplification factor, similarly to each of the amplifying portions 11a to 11c described above.

The RF amplifying circuit thus constructed is not formed in a single semiconductor chip, but is formed dividedly in two semiconductor chips. That is, the amplifying portions 11a to 11c and the amplifying portions 12a to 12c which are relatively large in the amount of heat generation are formed in the first semiconductor chip containing a compound semiconductor as a principal component and the control circuit 10 which is relatively small in the amount of heat generation is formed in the second semiconductor chip containing silicon as a principal component.

Next, the control of the amplifying portions by the control circuit will be described by using an example of controlling the final-stage one of the amplifying portions in the three stages.

Figure 3:
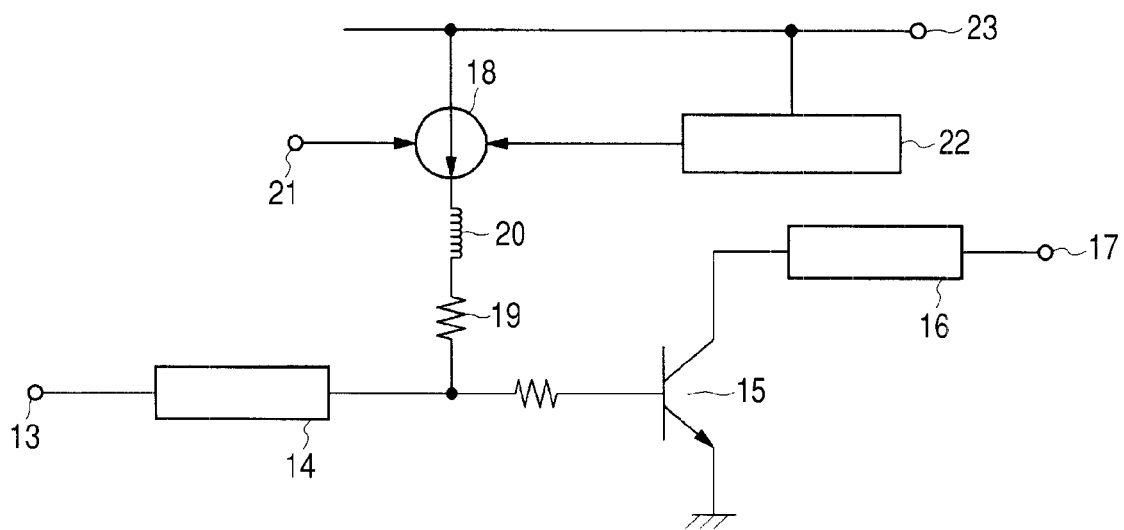
FIG. 3 is a circuit diagram showing part of a control circuit.

FIG. 3 is a circuit diagram showing respective structures of the amplifying portion and the control circuit. In FIG. 3, the final-stage amplifying portion has an input terminal 13 to which a signal from the intermediate-stage amplifying portion is inputted. The input terminal 13 is coupled to the base electrode of the HBT 15 having the function of amplifying a signal via a matching circuit 14. The emitter electrode of the HBT 15 is grounded and the collector electrode of the HBT 15 is coupled to an output terminal 17 via the matching circuit 16. In the final-stage amplifying portion thus constructed, a base current flows between the base electrode and emitter electrode of the HBT 15 in correspondence to the input signal and, in correspondence to the base current, an amplified current flows from the collector electrode to the emitter electrode. As a result, an amplified output signal is outputted from the output terminal. Because the input signal is a RF signal, to obtain an output signal having a waveform similar to that of the input signal, it is necessary to set the working point of the HBT 15 to a specified position. That is, even in a state with no input signal, it is necessary to cause the HBT 15 to perform an idling operation and allow a given collector current to flow. The working point of the HBT 15 is determined by an idling current, i.e., a collector current during a no-signal period. Therefore, to set the working point of the HBT 15, it is sufficient to set the base current in unique relation with the idling current to a specified value. As a result, the control circuit for controlling the amplifying portion is needed and a specified base current (bias current) is caused to flow in the HBT 15 by the control circuit even during a no-signal period.

For example, as shown in FIG. 3, the control circuit is constructed to supply the base current to the HBT 15 from a current source 18. That is, in the control circuit, the current source 18 is coupled to the base electrode of the HBT 15 via a bias resistor 19 and a RF-blocking inductor 20. To the current source 18, an output control terminal 21, a power source voltage detecting circuit 22, and a power source voltage terminal 23 are coupled. To the power source voltage detecting circuit 22, the power source voltage terminal 23 is coupled.

The control circuit is thus constructed. The control circuit sets the working point of the HBT 15 to a specified position by supplying the bias current to the base electrode of the HBT 15 from the current source 18. The magnitude of the bias current is controlled by an output control voltage applied to the current source 18. When the output control voltage applied to the output control terminal 21 exceeds a specified value, the power source voltage detecting circuit 22 is activated to restrict the output control voltage applied to the current source 18 and thereby hold the bas current constant. The value of the bias current is set in accordance with the power source voltage and is smaller as the power source voltage is higher.

The HBT 15 is operated by applying a power source potential (power source voltage) and a reference potential to the individual terminals. Specifically, the power source potential is applied to the collector electrode of the HBT 15 and the reference potential is applied to the emitter electrode of the HBT 15. To the base electrode, the idling current is caused to flow, while the input signal is inputted thereto. The reference potential is defined herein as a potential having an absolute value smaller than that of the power source potential and, e.g., a GND potential corresponds thereto. The GND potential is a potential substantially at 0 V, which is also termed a ground potential. By way of example, the reference potential will be described hereinbelow as the GND potential. In the HBT 15, the power source potential of a positive voltage is primarily applied to the collector electrode, and there is a case where a LDO (Low-Drop-Out) regulator may be inserted between the terminal to which the power source potential is applied and the collector electrode of the HBT 15. In the case of controlling the TBT 15 with the LDO regulator, the potential applied to the collector electrode is lower than the power source potential. In the HBT 15, there is also a case where a resistor is inserted between the terminals to which the reference potential is applied and the emitter electrode of the HBT 15. In such a case also, the power source potential and the reference potential are invariably used as the potentials supplied from the outside of the HBT 15. In the case with the HBT 15, only a positive potential is used as the power source potential. In the case with a HEMT (High Electron Mobility Transistor) also, it is common practice to use a positive potential as the power source potential. However, in the case with the HEMT, a negative potential may also be used in addition to the positive potential as voltages for controlling the gate electrode. That is, with the HEMT, there are cases where only the positive potential is used as the power source potential and where each of the positive potential and the negative potential is used as the power source potential. However, even when the negative potential is used, a potential of a voltage having a smaller absolute value is invariably termed the reference potential so that the GND potential fixed to about 0 V corresponds to an example of the reference potential.

Figure 4:
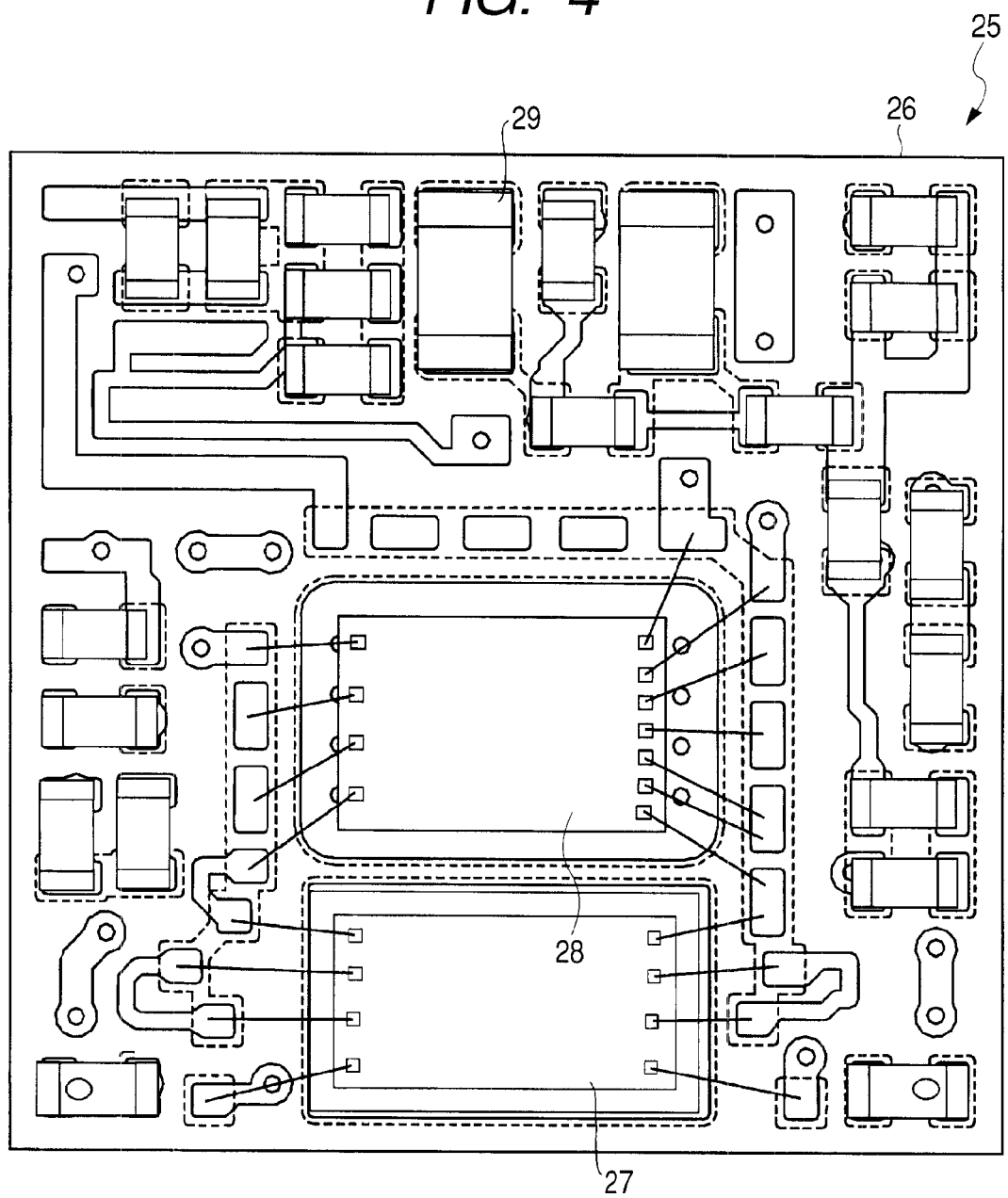
FIG. 4 is a plan view showing a packaged structure of the RF module.

A description will be given to a packaged structure of a RF module in the first embodiment. FIG. 4 is a plan view showing a mounting board for a RF module in the first embodiment. As shown in FIG. 4, in a RF module 25 in the first embodiment, a semiconductor chip (second semiconductor chip) 27, a semiconductor chip (first semiconductor chip) 28, and passive components 29 are mounted on a wiring board 26. The wiring board 26 is composed of, e.g., a printed wiring board and has a laminate structure consisting of a plurality of dielectric layers (insulating layers). The wiring board 26 has specified wires formed on the surface (principal surface) and back surface thereof and in the inside thereof. Some of the wires formed on the surface of the wiring board 26 and some of the wires formed on the back surface of the wiring board 26 are electrically coupled via vias formed in the thickness direction of the wiring board 26.

The semiconductor chip 27 contains silicon as a principal component and is formed with a control circuit for controlling an amplifying circuit. The control circuit is formed primarily of a MOSFET. The semiconductor chip 27 has a quadrilateral shape and a plurality of bonding pads are formed along the outer peripheral portion thereof. These bonding pads are coupled to terminals formed on the wiring board 26 by wires or the like.

The semiconductor chip 28 contains a compound semiconductor such as a gallium arsenide (GaAs) or indium phosphide (InP) as a principal component and is formed with HBTs composing amplifying portions. The semiconductor chip 28 also has a quadrilateral shape and a plurality of bonding pads are formed along the outer peripheral portion thereof. These bonding pads are also coupled to the terminals formed on the wiring board 26 by wires or the like.

The passive components 29 formed on the wiring board 26 are composed of, e.g., chip components and include a resistor, an inductance element, and a capacitor. These passive components 29 are electrically coupled to wires formed on the surface of the wiring board. The passive components 29 compose, e.g., matching circuits 14 and 15 shown in FIG. 3 or the like.

Figure 5:
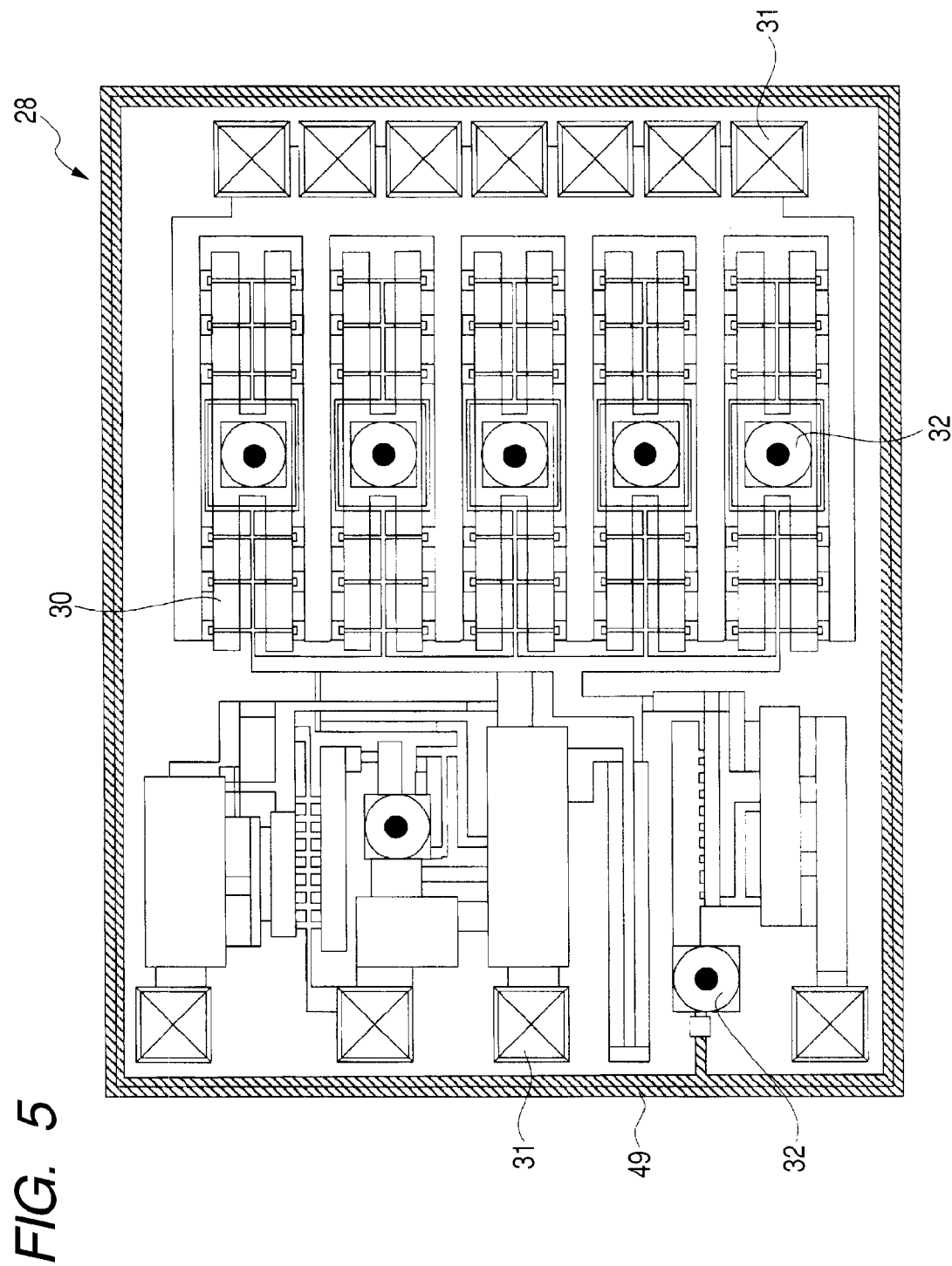
FIG. 5 is a view showing the layout of a semiconductor chip mounted in the RF module.

Subsequently, a structure of the semiconductor chip 28 mounted in the RF module 25 will be described. The semiconductor chip 28 mounted in the RF module 25 is formed of HBTs composing the amplifying portions of the RF amplifying circuit and the like. FIG. 5 is a view showing the layout of the semiconductor chip 28. As shown in FIG. 5, the semiconductor chip 28 has a rectangular shape and a plurality of HBTs 30 are formed in the inside thereof. In addition, bonding pads 31 are formed along the edges of the semiconductor chips 28. In the semiconductor chip 28, vias reaching the back surface thereof are further formed. The vias 32 are coupled to a back surface electrode formed on the back surface of the semiconductor chip 28 and have the function of coupling the back surface electrode coupled to the GND potential and the emitter electrodes of the HBTs 30. That is, the semiconductor chip 28 according to the first embodiment is constructed such that the GND potential applied to the emitter electrodes of the HBTs 30 is obtained from the back surface electrode via the vias 32.

In the outer peripheral portion of the semiconductor chip 28, a conductive layer 49 is formed to surround the outer peripheral portion. The conductive layer 49 is electrically coupled to the vias 32. Therefore, the conductive layer 49 formed to surround the outer peripheral portion is at the GND potential (reference potential). In the first embodiment, the conductive layer 49 is formed of a semiconductor layer. Thus, one of the characteristic features of the semiconductor chip 28 according to the first embodiment is that the conductive layer 49 is formed to surround the outer peripheral portion and the conductive layer 49 is at the GND potential. The characteristic feature will be described later.

Figure 6:
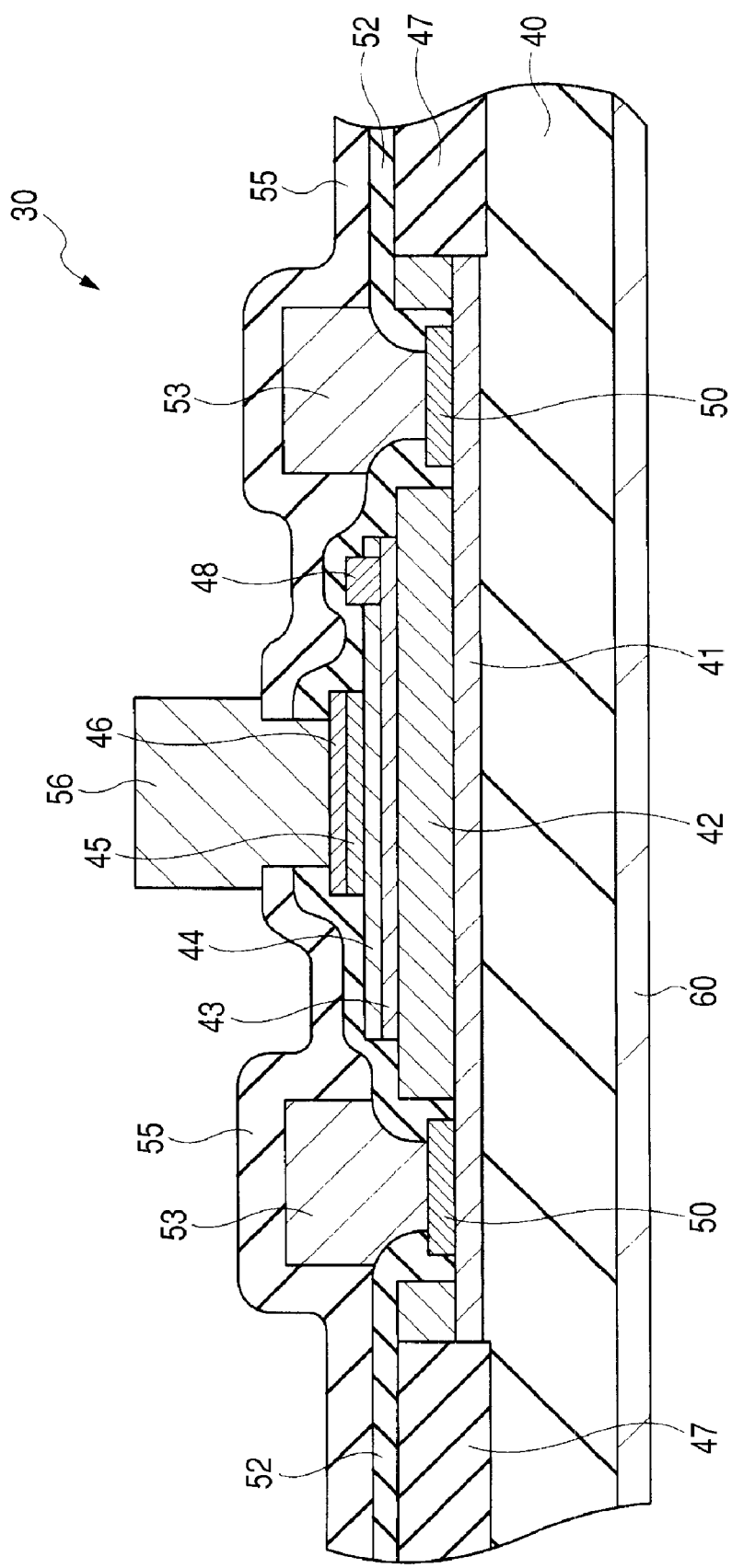
FIG. 6 is a cross-sectional view showing a structure of a HBT formed in the semiconductor chip.

Next, a description will be given to a structure of each of the HBTs 30 formed in the semiconductor chip 28. FIG. 6 is a cross-sectional view showing the structure of the HBT 30 formed in the semiconductor chip 28. As shown in FIG. 6, the back surface electrode composed of, e.g., a gold/nickel film (Au/Ni film) 60 is formed on the back surface of a GaAs substrate (compound semiconductor substrate) 40, which is among semi-insulating substrates. On the other hand, the HBT 30 is formed on the principal surface (element formation surface) of a GaAs substrate 40. The HBT 30 has a sub-collector semiconductor layer 41 formed on the GaAs substrate 40 and a collector semiconductor layer 42 formed on the sub-collector semiconductor layer 41. For example, the sub-collector semiconductor layer 41 is formed of an $n^+$-type GaAs layer and the collector semiconductor layer 42 is formed of an $n^-$-type GaAs layer.

On both sides of the sub-collector semiconductor layer 41 and the collector semiconductor layer 42, an isolation region 47 is formed. The isolation region 47 is formed by introducing helium, which is an example of a non-metal element, into each of the sub-collector semiconductor layer 41, the collector semiconductor layer 42, and the GaAs substrate 40. By the isolation region 47, a laminate film composed of the sub-collector semiconductor layer 41 and the collector semiconductor layer 42 is isolated so that individual element formation regions (active regions) are formed. Although helium is introduced into each of the sub-collector semiconductor layer 41, the collector semiconductor layer 42, and the GaAs substrate 40 to form the isolation region 47 in the first embodiment, an element to be introduced is not limited to helium. Because the isolation region 47 can be formed by introducing a non-metal element into a semiconductor layer, it is sufficient for the element to be introduced into the semiconductor layers to be a non-metal element. In particular, to form the isolation region 47, it is preferable to introduce the element deep into the semiconductor layer. Therefore, as the non-metal element, hydrogen (H), helium (He), boron (B), or the like can be used. Of such light elements, helium is preferably used in terms of its reduced tendency to affect the reliability of the elements.

In each of the element formation regions, a pair of trenches are provided in the collector semiconductor layer 42 and collector electrodes 50 are formed in the pair of trenches. Each of the collector electrodes 50 is formed of, e.g., an Au/Ni/AuGe film.

Between the pair of collector electrodes 50, the collector semiconductor layer 42 is formed. On the collector semiconductor layer 42, the base semiconductor layer 43 is formed. The base semiconductor layer 43 is formed of, e.g., a $p^+$-type GaAs layer. On the base semiconductor layer 43, a base electrode 48 is formed. The base electrode 48 is formed of, e.g., a Mo/Au/Pt/Ti/Pt film.

On the base semiconductor layer 43, an emitter semiconductor layer 44 is formed. As the emitter semiconductor layer 44, an $n^-$-type InGaP layer, e.g., is used. On the emitter semiconductor layer 44, an emitter electrode 46 is formed via a GaAs layer 45. The ember electrode 46 is formed of, e.g., WSiN film.

On the GaAs substrate 40 thus constructed, a protective film 52 composed of, e.g., a silicon nitride film (SiN) is formed, and openings are formed in the protective film 52. The openings are formed over the collector electrodes 50. Over the collector electrodes 50, collector wires 53 are formed to fill the openings. Onto the base electrode 48, a base wire is electrically coupled, though it is not shown in the cross-sectional view of FIG. 6. Subsequently, a protective film 55 composed of a silicon nitride film is formed on the protective film 52 including the upper surfaces of the collector wires 53. An opening is formed to extend through the protective film 55 and the protective film 52 and reach the emitter electrode 46, and an emitter wire 56 is formed to fill the opening.

In the HBT 30 thus constructed, the forbidden bandwidth of the emitter in the base-emitter junction can be increased to be larger than the forbidden bandwidth of the base by the heterojunction. Accordingly, carriers injected from the emitter into the base can be increased to be significantly large compared with carriers of opposite charge injected from the base into the emitter, which results in a characteristic feature of an extremely large current amplification factor. This is why the HBTs 30 are used in the semiconductor chip 28 mounted in the RF module. The plurality of HBTs 30 shown in FIG. 6 are coupled in parallel to form, e.g., the amplifying portions 11a to 11c and 12a to 12c shown in FIG. 2.

Figure 7:
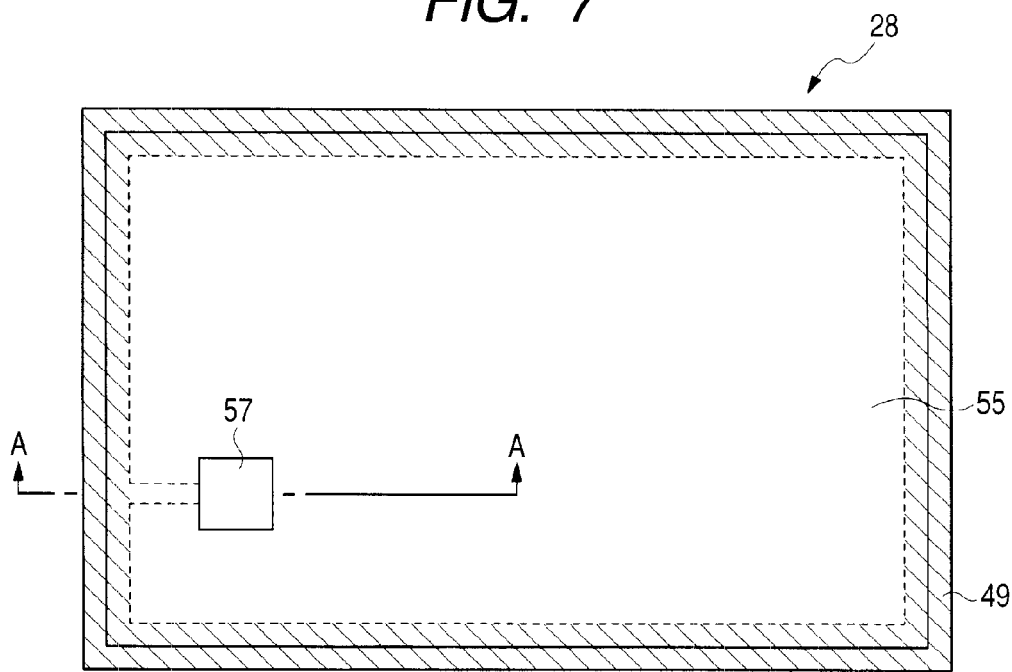
FIG. 7 is a schematic diagram showing a characteristic feature of the present invention in the semiconductor chip.

Next, a description will be given to the characteristic structure of the semiconductor chip 28 in the first embodiment. FIG. 7 is a schematic diagram obtained by viewing the semiconductor chip 28 from above the upper surface thereof. That is, the top view of the semiconductor chip 28 has a layout as shown in FIG. 5. In FIG. 7, however, only the characteristic structure of the layout shown in FIG. 5 is shown. In FIG. 7, the conductive layer 49 is formed in the outer peripheral portion of the semiconductor chip 28. The surface of the semiconductor chip 28 is covered with the protective film 55, but the protective film 55 is not formed to cover the entire peripheral portion of the semiconductor chip 28. The conductive layer 49 is partly exposed from the outer peripheral portion of the semiconductor chip 28 uncovered with the protective film 55. That is, a part of the conductive layer 49 is exposed from the protective film 55 and the other part of the conductive layer 49 is covered with the protective film 55. In other words, the end portion of the protective film 55 is located on the conductive layer 49 and the conductive layer 49 is partly exposed. The reason for the conductive layer 49 thus exposed from the protective film 55 is that, when the protective film 55 is formed on a dicing region, it is difficult to perform dicing. For this reason, the protective film 55 is not formed on the dicing region.

The conductive layer 49 formed to surround the outer peripheral portion of the semiconductor chip 28 is coupled to pads 57. Because the potential of each of the pads 57 is adjusted to be the GND potential, the potential of the conductive layer 49 coupled to the pads 57 is also fixed to the GND potential. Thus, the first embodiment is characterized in that the conductive layer 49 is formed in the outer peripheral portion of the semiconductor chip 28 and the potential of the formed conductive layer 49 is set to the GND potential (reference potential).

Figure 8:
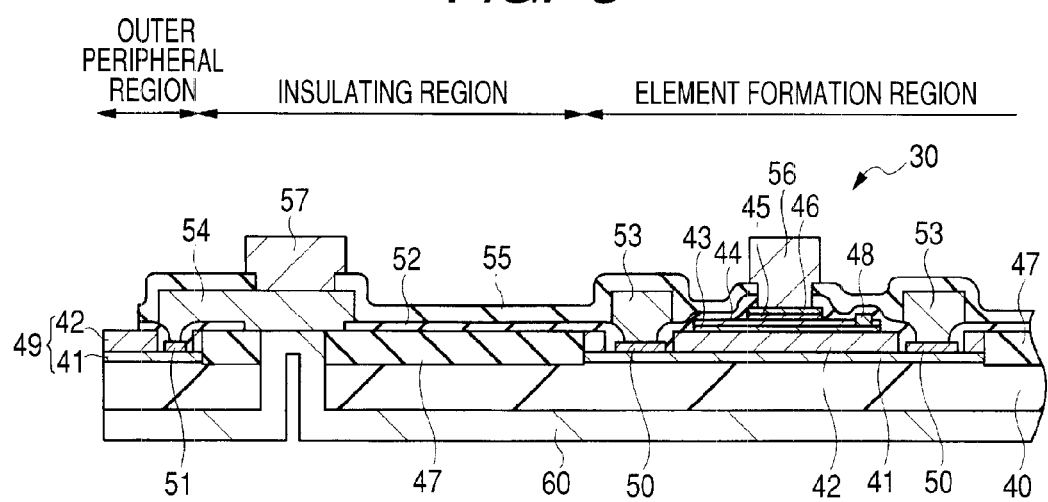
FIG. 8 is a cross-sectional view showing a cross section taken along the line A-A of FIG. 7.

The characteristic structure will be further described with reference to a cross-sectional view taken along the line A-A of FIG. 7. FIG. 8 is the cross-sectional view taken along the line A-A of FIG. 7. As shown in FIG. 8, each of the HBTs 30 described above is formed in the element formation regions. An insulating region is formed outside the element formation region and an outer peripheral region is formed outside the insulating region. In the insulating region, the isolation region 47 is formed in the GaAs substrate 40. The isolation region is formed by implanting helium ions into a multilayer film serving as the sub-collector semiconductor layer 41 and the collector semiconductor layer 42 in the element formation region. That is, the isolation region according to the first embodiment is formed by introducing the helium ions into the sub-collector semiconductor layer 41 and the collector semiconductor layer 42.

In the outer peripheral region located outside the insulating region, the semiconductor layer is formed on the GaAs substrate 40. The semiconductor layer is formed of the sub-collector semiconductor layer 41 and the collector semiconductor layer 42. That is, the semiconductor layer formed in the outer peripheral region is formed of the same semiconductor layers as the sub-collector semiconductor layer 41 and the collector semiconductor layer 42 which are formed in the element formation region. It follows therefore that the layers serving as the sub-collector semiconductor layer 41 and the collector semiconductor layer 42 formed on the GaAs substrate 40 in the element formation region serve as the isolation region in the insulating region, and further compose the conductive layer 49 in the outer peripheral region. The conductive layer 49 is formed over to the end portion of the outer peripheral region. Accordingly, the conductive layer 49 reaches the side surface of the semiconductor chip 28 to be exposed also at the side surface of the semiconductor chip 28.

In the outer peripheral region, a trench is formed in the collector semiconductor layer 42 and an ohmic electrode 51 is formed in the trench. In the outer peripheral region, the protective film 52 is formed on the collector semiconductor layer 42 including the trench, and an opening is formed in the protective film 52. In other words, the protective film 52 has been patterned to expose the ohmic electrode 51 provided in the trench and not to reach the end portion of the outer peripheral region. As a result, the collector semiconductor layer 42 composing the conductive layer 49 is exposed at the end portion of the outer peripheral region, while a wire 54 in direct contact with the ohmic electrode 51 can be formed. The wire 54 is formed of, e.g., a Pt/Au/Ti film simultaneously with the collector wires 53. Since the wire 54 is formed of a metal wire, when brought into direct contact with the conductive layer 49 as the semiconductor layer, the wire 54 cannot make ohmic contact therewith. Therefore, to implement ohmic contact between the wire 54 and the conductive layer 49, the first embodiment has provided the ohmic electrode 51 between the conductive layer 49 and the wire 54. That is, the ohmic electrode 51 has the function of implementing ohmic contact between the conductive layer 49 and the wire 54 and is formed of, e.g., an Au/Ni/AuGe film, similarly to the collector electrode 50.

The wire 54 is formed to extend from the outer peripheral region to the insulating region. In the insulating region, the wire 54 is coupled to a via hole extending through the GaAs substrate 40 and the isolation region 47. On the back surface of the GaAs substrate 40 including the inside of the via hole, a back surface electrode composed of a Au/Ni film 60 is formed. As a result, the back surface electrode and the wire 54 are electrically coupled via the via formed by burying the Au/Ni film 60 in the via hole. On the other hand, the wire 54 and the conductive layer 49 are electrically coupled via the ohmic electrode 51. It follows therefore that the conductive layer 49 and the back surface electrode are electrically coupled. Since the GND potential (ground potential) is supplied to the back surface electrode, the potential of the conductive layer 49 electrically coupled to the back surface electrode becomes the GND potential. In particular, by forming the ohmic electrode 51 between the conductive layer 49 and the wire 54, the potential of the conductive layer 49 can be reliably set to the GND potential. In this manner, it is possible to implement the characteristic structure of the first embodiment in which the conductive layer 49 is formed to surround the outer peripheral portion of the semiconductor chip 28 and the potential of the conductive layer 49 is set to the GND potential.

On the protective film 52 including the upper surface of the wire 54, the protective film 55 composed of the silicon nitride film 55 is further formed. The protective film 55 also does not reach the end portion of the outer peripheral region, similarly to the protective film 52. As a result, the end portion of the outer peripheral region is not covered with the protective film 52 and the protective film 55 so that the conductive layer 49 as the semiconductor layer is exposed. This allows easy dicing when the semiconductor chip 28 is obtained by dicing the semiconductor wafer. In addition, an opening is provided in the protective film 55 formed on the wire 54 and a pad 57 is formed in the opening.

The characteristic feature of the semiconductor chip 28 in the first embodiment is that the conductive layer 49 is formed to surround the outer peripheral portion of the semiconductor chip 28 and the potential of the conductive layer 49 is set to the GND potential. Next, a description will be given to an advantage offered by thus constructing the semiconductor chip 28 in comparison with the technology examined by the present inventors.

Figure 9A:
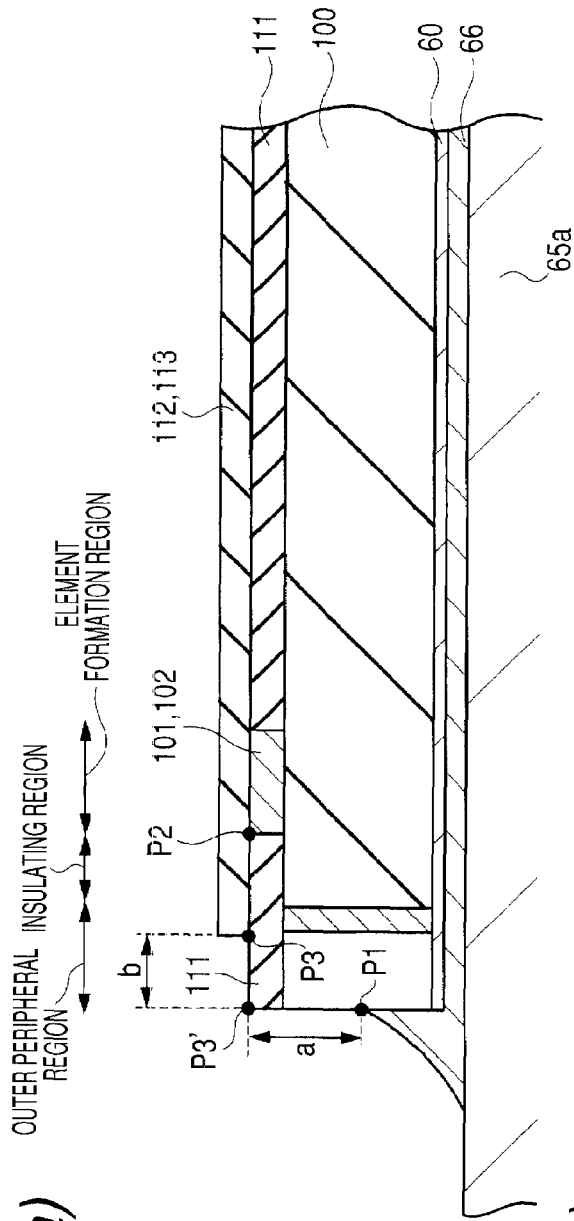
FIG. 9A is a schematic cross-sectional view of a semiconductor chip examined by the present inventors and FIG. 9B is a graph showing the potentials at specified positions in the semiconductor chip.
Figure 27:
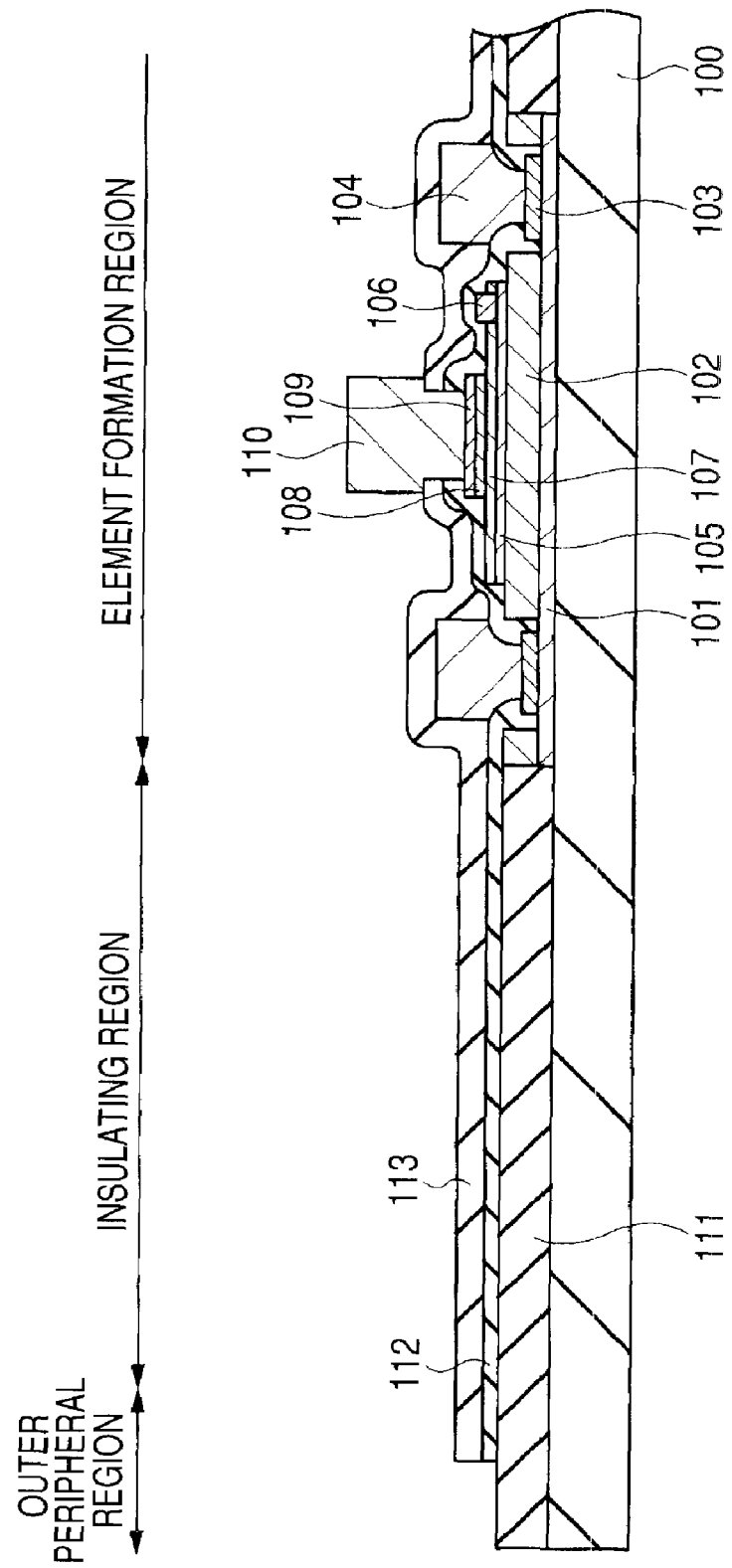
FIG. 27 is a cross-sectional view examined by the present inventors and showing a structure of a HBT.

FIG. 9A schematically shows the RF module in which the semiconductor chip shown in FIG. 27 is mounted on the wiring board. That is, in FIG. 9A, the HBT is formed in the element formation region of the GaAs substrate 100 as a semi-insulating substrate. In FIG. 9A, the sub-collector semiconductor layer 101 and collector semiconductor layer 102 of the HBT are schematically shown. From the insulating region over to the outer peripheral region, an isolation region 111 is formed. The isolation region 11 is formed by implanting helium ions into the same semiconductor layers as the sub-collector semiconductor layer 101 and the collector semiconductor layer 102. Over the isolation region 111, the sub-collector semiconductor layer 101, and the collector semiconductor layer 102, protective films 112 and 113 are shown. The protective films 112 and 113 extend from the element formation region and reach the insulating region, but do not reach the outer peripheral region. Therefore, in the outer peripheral region, the isolation region 111 is exposed.

On the back surface of the GaAs substrate 100, the back surface electrode composed of the Au/Ni film 60 is formed. To the back surface electrode, a wire 65a formed in the wiring board is electrically coupled via a silver paste 66. Since the GND potential is supplied to the wire 65a formed in the wiring board, the silver paste 66 electrically coupled to the wire 65a and the back surface electrode are at the GND potential. A moisture resistance test is performed with respect to the RF module thus constructed. The moisture resistance test is performed in a state where, after specified temperature and humidity conditions are set, the HBT is operated. In other words, the moisture resistance test is performed in a state where the power source potential is applied to the sub-collector semiconductor layer 101 and collector semiconductor layer 102 of the HBT. When the moisture resistance test is performed in the state where the HBT is thus operated, the isolation region 111 formed in the outer peripheral region degenerates to degrade the adhesion between the degenerated isolation region 111 and each of the protective films 112 and 113 so that a gap is formed. As a result, it has been newly found that an impurity such as moisture enters the RF module from the gap to cause the problem that an element, such as the HBT, and a wire become faulty.

Figure 9B:
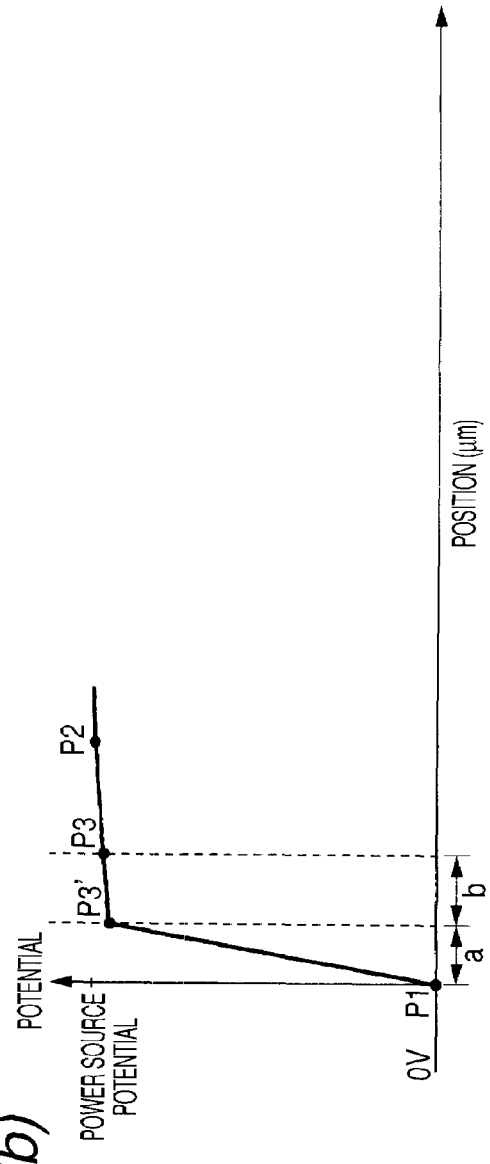

As a result of examining the cause of the problem, the occurrence of the following phenomenon has been recognized. FIG. 9B is a graph showing the relations between specified positions in the semiconductor chip and potentials at the positions. As shown in FIGS. 9A and 9B, the position P1 is at the GND potential due to contact with the silver paste 66. On the other hand, the position P2 is at the power source potential due to contact with the sub-collector semiconductor layer 101 and collector semiconductor layer 102 to which the power source voltage has been applied. It may be considered that, because the position P3 and the position P3' are located in the isolation region 111 as the insulating region, they do not undergo the influence of the sub-collector semiconductor layer 101 and collector semiconductor layer 102 to which the power source voltage has been applied. However, in actuality, the isolation region 111 in contact with the sub-collector semiconductor layer 101 and the collector semiconductor layer 102 can be considered as a high-resistance region, not a complete insulating region. That is, it can be assumed that, since the isolation region 111 is formed by implanting helium ions into the semiconductor layer, the isolation region 111 is not a complete insulating region but a high-resistance region.

As a result, it has been proved that even the positions P3 and P3' located in the isolation region 111 are in a state where a potential close to the power source potential is applied. In other words, a potential close to the power source potential is applied even at the position P3 located at the boundary between the isolation region 111 and the protective films 112 and 113.

In the moisture resistance test, the present inventors have found that specified temperature and humidity conditions, the presence of moisture and an impurity, and the presence of a potential conspire to cause the degeneration of the isolation region 111. This is presumably because, when an impurity derived from, e.g., a substance contained in the silver paste 66 or the like adheres to the isolation region 111 exposed in the outer peripheral region, the degeneration of the isolation region is more likely to occur since the potential has been applied to the exposed isolation region 111. When the isolation region 111 exposed in the outer peripheral region degenerates, the adhesion between the isolation region 111 and the protective films 112 and 113 deteriorates to form a gap. As a result, the impurity enters from the gap to conceivably promote a corrosive reaction (electrochemical reaction). Thus, it can be seen that, in the structure in which the exposed isolation region 111 is formed in the outer peripheral region, the problem of the entrance of the impurity resulting from the degeneration of the isolation region 11 becomes conspicuous.

To prevent this, the first embodiment has adopted the structure in which the conductive layer is formed to surround the outer peripheral portion of the semiconductor chip and the potential of the conductive layer is set to the GND potential. FIG. 10A schematically shows a RF module in which the semiconductor chip shown in FIG. 8 is mounted on the wiring board. That is, in FIG. 10A, the HBT is formed in the element formation region of the GaAs substrate 40 as the semi-insulating substrate. In FIG. 10A, the sub-collector semiconductor layer 41 and collector semiconductor layer 42 of the HBT are schematically shown. In the insulating region, the isolation region 47 is formed. The isolation region 47 is formed by implanting helium ions into the same semiconductor layers as the sub-collector semiconductor layer 41 and the collector semiconductor layer 42. The conductive layer 49 is formed outside the isolation region 47 formed in the insulating region. Briefly, the conductive layer 49 is formed in the outer peripheral region outside the insulating region. The provision of the conductive layer 49 is among the characteristic features of the first embodiment. The conductive layer 49 is formed of the same semiconductor layers as the sub-collector semiconductor layers 41 and the collector semiconductor layers 42.

Over the element formation region and the insulating region, the protective films 52 and 55 are formed to extend over to the outer peripheral region. However, the protective films 52 and 55 are not formed to cover the entire outer peripheral region so that the conductive layer 49 is partly exposed in the outer peripheral region. That is, in the first embodiment, not the isolation region 47 but the conductive layer 49 is formed in the region exposed from the protective films 52 and 55.

On the back surface of the GaAs substrate 40, the back surface electrode composed of the Au/Ni film 60 is formed. To the back surface electrode, the wire 65a formed in the wiring board is electrically coupled via the silver paste 66. Since the GND potential is supplied to wire 65a formed in the wiring board, the silver paste 66 and the back surface electrode which are electrically coupled to the wire 65a are at the GND potential. The back surface electrode is further electrically coupled to the conductive layer 49 via the via formed in the GaAs substrate 40. Therefore, the conductive layer 49 is at the GND potential, which is also among the characteristic features of the first embodiment. A moisture resistance test is performed with respect to the RF module thus constructed. The moisture resistance test is performed in a state where, after specified temperature and humidity conditions are set, the HBT is operated. That is, the moisture resistance test is performed in the state where the power source potential is applied to the sub-collector semiconductor layer 101 and collector semiconductor layer 102 of the HBT. Even when the moisture resistance test is performed in the state where the HBT is thus operated, the first embodiment achieves the remarkable effect that the degeneration of the conductive layer does not occur. This ensures adhesion between the conductive layer 49 and the protective films 52 and 55 and can prevent the entrance of the impurity from between the conductive layer 49 and the protective films 52 and 55.

A description will be given to the reason that the effect is obtainable. FIG. 10B is a graph showing the relations between specified positions in the semiconductor chip and potentials at the positions. As shown in FIGS. 10A and 10B, the position P1 is at the GND potential due to contact with the silver paste 66. On the other hand, the position P2 is at the power source potential due to contact with the sub-collector semiconductor layer 41 and collector semiconductor layer 42 to which the power source voltage has been applied. At this time, since the isolation region 47 in contact with the sub-collector semiconductor layer 41 and the collector semiconductor layer 42 is assumed to serve not as a complete insulating region but as a high-resistance region, it is conceived that the isolation region 47 is at a potential close to the power source potential. In the first embodiment, however, the conductive layer 49 is formed outside the isolation region 47 and the conductive layer 49 is at the GND potential. As a result, each of the position P3 and the position P3' is at the GND potential. That is, in the first embodiment, the end portions of the protective films 52 and 55 are located over the conductive layer 49 so that the exposed layer is the conductive layer 49 to which the GND potential is supplied. Therefore, although it is considered that the degeneration of the conductive layer 49 occurs in the moisture resistance test when factors such as specified temperature and humidity conditions, the presence of an impurity, and the presence of a potential are each observed in the exposed conductive layer 49, any of the four factors of specified temperature and humidity conditions, the presence of an impurity, and the presence of a potential lacks in the first embodiment since the GND potential is supplied to the exposed conductive layer 49. This is why the effect that the degeneration of the conductive layer 49 does not occur is obtained. In other words, the degeneration of the conductive layer 49 can be prevented by forming the layer exposed from the protective films 52 and 55 from the conductive layer 49 as the semiconductor layer and supplying the GND potential to the conductive layer 49. This ensures adhesion between the protective films 52 and 55 and the conductive layer 49 and can prevent the entrance of an impurity from between the protective films 52 and 55 and the conductive layer 49.

In the first embodiment, the adhesion can be ensured unless the degeneration of the conductive layer 49 occurs at the position P3 as the end portion of each of the protective films 52 and 55. Accordingly, it is sufficient to form the conductive layer 49 to which the GND potential is supplied in the region exposed from the protective films 52 and 55. However, as shown in FIG. 10A, the first embodiment has formed the conductive layer 49 even to a position inner than the position P3 by the distance c. This is because displacement when the protective films 52 and 55 are formed is considered. Even when the end portions of the protective films 52 and 55 are inwardly displaced, by forming the conductive layer 49 under the end portions of the protective films 52 and 55, the entrance of the impurity resulting from the degeneration of the conductive layer 49 can be reliably prevented.

In this manner, the moisture resistance of the semiconductor chip can be improved in the first embodiment. It is conceived that a first cause of the deterioration of the moisture resistance is that the isolation region exposed in the outer peripheral region serves not as a complete insulating region but as a high-resistance region. That is, because the isolation region serves not as a complete insulating region but as a high-resistance region, a potential close to the power source potential is applied even to the isolation region exposed from the outer peripheral region when the HBT is operated. The deterioration of the moisture resistance could conceivably result from the application of the potential. Although the isolation region is formed in this case by implanting helium ions into the semiconductor layers, the isolation region in the semiconductor chip formed with the HBT may also be formed by another method. FIG. 11 is a view showing an example in which the HBT 30 is isolated using another isolation region. In FIG. 11, the HBT 30 is formed in the element formation region, and the sub-collector semiconductor layer 41 and the collector semiconductor layer 42 are formed as part of the HBT 30 on the GaAs substrate 40. In a method of implanting helium ions into a semiconductor layer as used in the first embodiment, the sub-collector semiconductor layer 41 and the collector semiconductor layer 42 each formed as part of the HBT 30 are also left in the insulating region so that the isolation region is formed by implanting helium ions into the left semiconductor layers.

By contrast, in the example shown in FIG. 11, the isolation region is formed by removing the sub-collector semiconductor layer 41 and the collector semiconductor layer 42 formed in the insulating region and in the outer peripheral region. It follows therefore that, in the insulating region, the protective films 52 and 55 are formed directly on the GaAs substrate 40 as the semi-insulating substrate. Since the protective films 52 and 55 are silicon nitride films as complete insulation films, even when the power source potential is applied to the sub-collector semiconductor layer 41 and the collector semiconductor layer 42 by operating the HBT, the potential is not supplied to the region exposed in the outer peripheral portion. Accordingly, in this method, the problem of the deterioration of the moisture resistance described in the first embodiment does not become conspicuous in the isolation region. That is, it can be seen that a problem associated with moisture resistance is conspicuous in the case of adopting a structure in which an isolation region is formed by a method of implanting helium ions into a semiconductor layer, as adopted in the first embodiment. In other words, it can be seen that the structure in which the conductive layer is formed to surround the outer peripheral portion of the semiconductor chip and the potential of the conductive layer is set to the GND potential is particularly effective in the case where the isolation region serves not as a complete insulating region but as a high-resistance region.

As described above, since the moisture resistance does not present a problem with the isolation structure (hereinafter referred to as a mesa isolation structure) in which the isolation region is formed by removing the sub-collector semiconductor layer 41 and the collector semiconductor layer 42 each formed in the insulating region and in the outer peripheral region, it can be considered that the isolation region is formed appropriately in accordance with the method. However, the following problem occurs in the mesa isolation structure. That is, the mesa isolation structure in a compound semiconductor substrate such as a GaAs substrate or an InP substrate is formed by removing the semiconductor layer (sub-collector semiconductor layer 41 and the collector semiconductor layer 42) by wet etching. In the wet etching performed at this time, the cross-sectional configuration formed by etching differs depending on crystal orientation due to the anisotropic property of the etching. In addition, because a stepped portion is formed in the mesa isolation structure, there is a problem that a wire formed in the mesa isolation structure is likely to be broken. To circumvent the problem in the mesa isolation structure, it can be considered to planarize the stepped portion resulting from the mesa isolation structure. However, the arrangement adds a planarization step to the manufacturing process steps, which complicates the manufacturing process steps and increases product cost.

By contrast, in an isolation structure obtained by leaving the semiconductor layer (sub-collector semiconductor layer 41 and the collector semiconductor layer 42) in the insulating region and introducing helium ions into the semiconductor layer, the isolation region can be formed of the same layers as the sub-collector semiconductor layer 41 and the collector semiconductor layer 42. As a result, a stepped portion is not formed between the insulating region and the element formation region. This offers the advantage that the problem of a broken wire does not occur. Moreover, because it is unnecessary to add the planarization step to the manufacturing process steps, the manufacturing process steps can be simplified and the increased product cost can be suppressed. From such a viewpoint, the isolation region formed by implanting helium ions into the semiconductor layer is mainly used in a compound semiconductor substrate formed with HBTs.

However, in the isolation region formed by implanting helium ions into the semiconductor layer, the moisture resistance presents a problem since the isolation region serves not as a complete insulating region but as a high-resistance region, as described above. To prevent this, a structure as shown in the first embodiment is adopted in which the conductive layer is formed in the outer peripheral region outside the insulating region and the potential of the conductive layer is set to the GND potential. By adopting the structure, it is possible to also improve the moisture resistance of the semiconductor chip, while holding the advantage of the isolation region formed by implanting helium ions into the semiconductor layer. This allows an improvement in the reliability of the semiconductor chip formed with the HBT and further allows an improvement in the reliability of a RF module in which the semiconductor chip is mounted.

Figure 12:
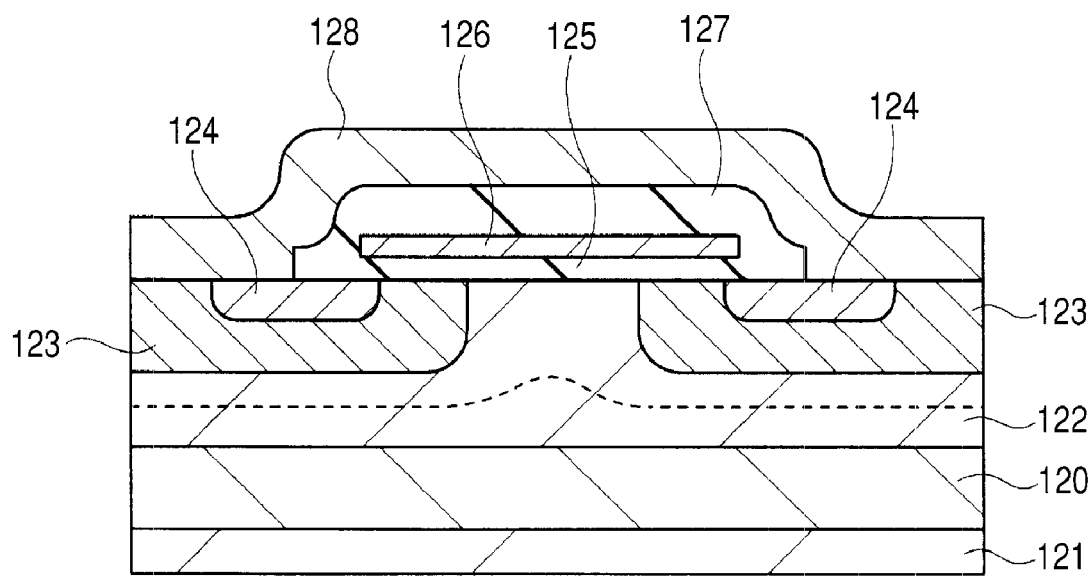
FIG. 12 is a cross-sectional view examined by the present inventors and showing a planar power MOSFET formed in a silicon substrate.

Next, a description will be given to the difference between a semiconductor device in which a power MOSFET is formed using a silicon substrate and a semiconductor device using a semi-insulating substrate (compound semiconductor substrate). First, the description will be given to a structure of a planar power MOSFET formed on the silicon substrate. FIG. 12 is a cross-sectional view showing a structure of the planar power MOSFET formed on the silicon substrate. In FIG. 12, a drain electrode 121 is formed on the back surface of a silicon substrate 120 in which an n-type impurity has been introduced. On the other hand, an n$^-$-type impurity diffusion region 122 is formed in the principal surface of the silicon substrate 120. The n$^-$-type impurity diffusion region 122 serves as a drain region, and a p-type impurity diffusion region 123 is formed in the n$^-$-type impurity diffusion region 122. In the p-type impurity diffusion region 123, an n$^+$-type impurity diffusion region 124 is further formed. The n$^+$-type impurity diffusion region 124 serves as a source region.

On the n$^-$-type impurity diffusion region 122, a gate electrode 236 is formed with a gate insulating film 125 interposed therebetween. The gate electrode 126 is formed in alignment with the n$^+$-type impurity diffusion region 124 serving as the source region. On the gate electrode 126, an insulating film 127 is formed. On the insulating film 127, a source electrode 128 is formed. The source electrode 128 is electrically coupled to the n$^+$-type impurity diffusion region 124.

A description will be given to the operation of the planar power MOSFET thus constructed. A specified potential difference is produced between the source electrode 128 and the drain electrode 121. Then, a voltage not less than a threshold voltage is applied to the gate electrode 126. As a result, an n-type channel is formed in the p-type impurity diffusion region 123 so that the source electrode 128 and the drain electrode 121 are electrically coupled via the n-type channel. Consequently, a current controlled by the gate electrode 126 flows between the source electrode 128 and the drain electrode 121.

Figure 13:
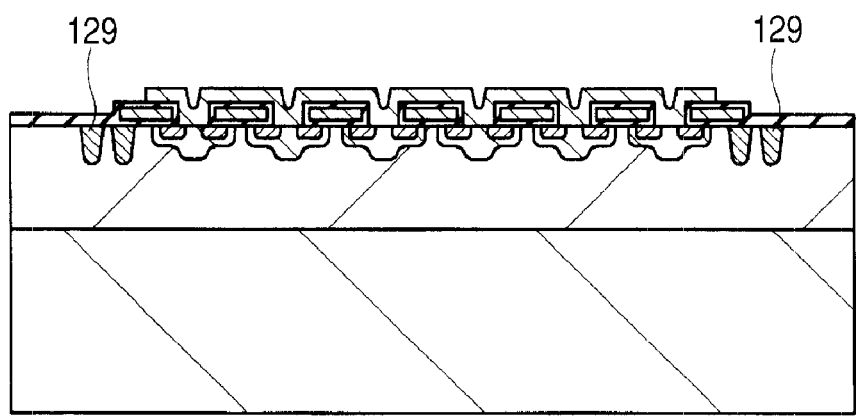
FIG. 13 is a cross-sectional view examined by the present inventors and showing a guard ring formed in the silicon substrate.

The planar power MOSFET formed in the silicon substrate 120 has a structure in which the gate electrode 126 covers the n$^-$-type impurity diffusion region 122 serving as the drain region via the gate insulating film 125. As a result, a depletion layer (indicated by the broken line of FIG. 12) extending from the planar power MOSFET (cell) is coupled at a relatively low voltage to an adjacent cell so that a potential surface is a plane junction which is parallel with the surface of the silicon substrate 120. Accordingly, the breakdown voltage of the planar power MOSFET is determined not by the individual cells but by a junction structure in the outer peripheral region surrounding the large number of cells. Therefore, as shown in FIG. 13, the silicon substrate has a semiconductor layer 129 (guard ring) formed in the outer peripheral portion surrounding the large number of cells to increase the breakdown voltage. That is, in the planar power MOSFET formed in the silicon substrate, it is common practice to form the semiconductor layer in the outer peripheral region of the semiconductor chip and increase the breakdown voltage with the semiconductor layer.

By contrast, in a semi-insulating substrate such as a GaAs substrate or an InP substrate, the entire surface of the semiconductor chip is in a depleted state at a specific resistance of 10$^7$ O·cm or more. As a result, in the outer peripheral portion of the semiconductor chip, a sufficient breakdown voltage is guaranteed so that it is unnecessary to devise special means for increasing the breakdown voltage. That is, in the semi-insulating substrate, it is unnecessary to form a semiconductor layer in the outer peripheral region of the semiconductor chip for an increase in the breakdown voltage of the HBT and it is common practice not to devise special means. Thus, in contrast to the silicon substrate in which it is common practice to form the semiconductor layer in the outer peripheral region for an increase in the breakdown voltage of the planar power MOSFET, it is common practice for a person skilled in the art not to provide the semiconductor layer for increasing the breakdown voltage in the semi-insulating substrate.

Against such a backdrop, in the first embodiment, the conductive layer is provided in the outer peripheral region of the semi-insulating substrate formed with the HBTs and the conductive layer is set at the GND potential. The structure is novel with the semi-insulating substrate. The structure according to the first embodiment is not needed to increase the breakdown voltage of the HBT, but is achieved for another purpose of improving the moisture resistance of the semiconductor chip.

When the conductive layer is provided in the outer peripheral region of the semi-insulating substrate to increase the breakdown voltage of the HBT, it is conceived that a technology commonly used for the silicon substrate has the motivation to do so. However, in the first embodiment, consideration should be given to the following point. That is, it has been newly found that, when there is the high-resistance isolation region exposed in the outer peripheral portion of the semi-insulating substrate upon operating the HBT, a potential is applied to the isolation region exposed in the outer peripheral portion, and the application of the potential to the isolation region exposed in the outer peripheral portion has been proved to be the cause of the degeneration of the isolation region. As a result of tracking down such a problem, it has been found that, by forming the conductive layer such that the outer peripheral portion of the semi-insulating substrate is surrounded thereby and setting the conductive layer to the GND potential, the degeneration of the exposed conductive layer can be prevented. In other words, the conductive layer is provided as a replacement for the exposed isolation region and the conductive layer is formed to set the exposed layer at the GND potential. From this, it cannot be assumed that, even though there is the structure in which the semiconductor layer (guard ring) is provided in the silicon substrate to increase the breakdown voltage, a person skilled in the art could easily conceive of the characteristic structure of the first embodiment. In other words, it can said that the technical idea of providing the semiconductor layer in the silicon substrate to increase the breakdown voltage contains no description of a motivation for conceiving of the characteristic structure of the first embodiment.

As an example of the application of the guard ring in the semi-insulating substrate, there is a structure (zipper zone) in which a metal layer is formed in order to prevent a crack caused by dicing from proceeding in the semi-insulating substrate. However, the structure is different from the structure according to the first embodiment in that the semiconductor layer is formed with the conductive layer. The structure is also different in that the metal layer need not be set at the GND potential in the zipper zone, while the conductive layer need to be set at the GND potential in the first embodiment.

There is also another example in which the guard ring is formed to prevent the entrance of moisture. However, the structure is based on the technological idea of forming a barrier wall by stacking metal wires and no consideration has been given to an electric mechanism. As a result, the conductive layer is not fixed to the GND potential and, in this point, the structure is different from the structure according to the first embodiment. That is, it may be said that the structure of the other example is the same as the structure according to the first embodiment in terms of preventing the entrance of an impurity. However, the first embodiment embodies the technical idea which prevents the degeneration of the conductive layer formed in the outer peripheral region by setting the conductive layer at the GND potential to prevent the entrance of an impurity resulting from the deterioration of the adhesion between the degenerated conductive layer and the protective films, rather than the technical idea of forming the barrier wall.

Thus, the first embodiment has found a novel problem and solved the new problem, and has a novel structure.

In most cases, the guard ring structure formed in the silicon substrate adopts a structure in which multilayer metal wires forming the barrier wall are coupled to diffusion layers. However, even when the structure is applied to the semi-insulating substrate, a region in which the multilayer wiring structure for the guard ring and the diffusion layers for the guard ring are formed is also needed. This causes the problem of an increase in the size of the semiconductor chip. By contrast, in the first embodiment, part of the isolation region formed in the outer peripheral region of the semiconductor chip is changed into the conductive layer. As a result, the advantage is offered that, even though the conductive layer is provided, the problem of an increase in the size of the semiconductor chip does not occur. That is, with the structure according to the first embodiment, it can be said that the conductive layer is formed in place of the isolation region exposed in the outer peripheral region, not that the conductive layer is newly provided in the outer peripheral region of the semiconductor chip. As a result, it is possible to improve the moisture resistance of the semiconductor chip without increasing the size of the semiconductor chip.

Figure 14:
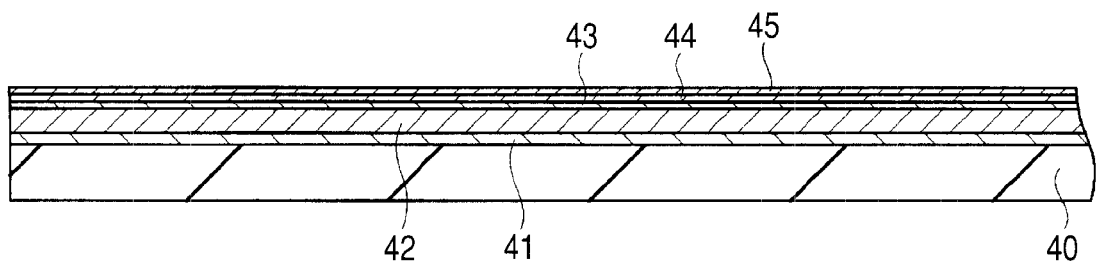
FIG. 14 is a cross-sectional view showing the process steps of manufacturing a semiconductor device in the first embodiment of the present invention.

A description will be given to a manufacturing method of the semiconductor device according to the first embodiment with reference to the drawings. As shown in FIG. 14, the semi-insulating substrate is prepared in a wafer state. The semi-insulating substrate is a substrate composed of a compound semiconductor having a large forbidden bandwidth. When a compound semiconductor having a large forbidden bandwidth is doped with a certain type of impurity, a deep state level is formed in the forbidden band so that electrons and holes are fixed at the deep state level. As a result, the density of carriers is extremely lowered to be close to that of an insulating material. Such a substrate is termed a semi-insulating substrate. Although the first embodiment uses the GaAs substrate 40 as an example of the semi-insulating substrate, it is also possible to use an InP substrate or the like. In the GaAs substrate 40, a deep state level is formed by doping with Cr, In, oxygen, or the like or introducing an excess of arsenide therein, so that the GaAs substrate 40 becomes the semi-insulating substrate.

Next, the sub-collector semiconductor layer 41 is formed on the GaAs substrate 40 and the collector semiconductor layer 42 is formed on the sub-collector semiconductor layer 41. The sub-collector semiconductor layer 41 is formed of, e.g., an $n^+$-type GaAs layer, while the collector semiconductor layer 42 is formed of an $n^-$-type GaAs layer. The $n^+$-type GaAs layer and the $n^-$-type GaAs layer can be formed by doping the GaAs layer with silicon (Si) as an n-type impurity or the like. For example, the $n^+$-type GaAs layer and the $n^-$-type GaAs layer can be formed by an epitaxial growth method. On the collector semiconductor layer 42, the base semiconductor layer 43 is further formed. On the base semiconductor layer 43, the emitter semiconductor layer 44 is further formed. The base semiconductor layer 43 is formed of a $p^+$-type GaAs layer. The $p^+$-type GaAs layer can be formed by doping a GaAs layer with carbon (C) as a p-type impurity. For example, the $p^+$-type GaAs layer can be formed by an epitaxial growth method. The emitter semiconductor layer 44 is formed of an $n^-$-type InGaP layer. The $n^-$-type InGaP layer is formed by doping an InGaP layer with silicon (Si) as an n-type impurity. For example, the $n^-$-type InGaP layer can be formed by an epitaxial growth method. On the emitter semiconductor layer 44, the GaAs layer 45 is formed by, e.g., an epitaxial growth method.

Figure 15:
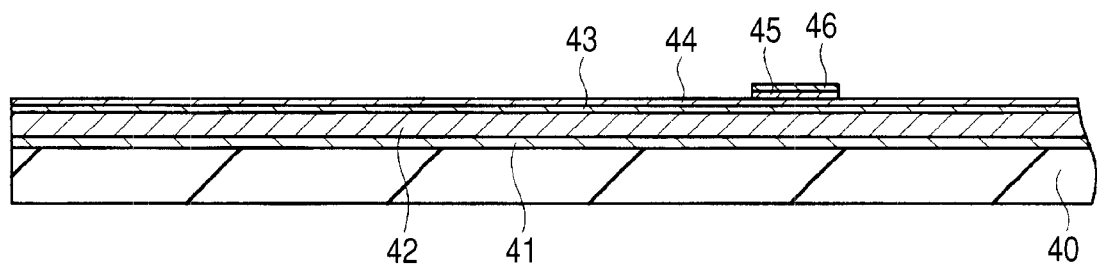
FIG. 15 is a cross-sectional view showing the process steps of manufacturing the semiconductor device subsequent to those shown in FIG. 14.

Subsequently, as shown in FIG. 15, a WSiN film is formed on the GaAs layer 45. Thereafter, by using a photolithographic technique and an etching technique, the WSiN film and the GaAs layer are patterned. In this manner, the emitter electrode 46 composed of the WSiN film can be formed.

Figure 16:
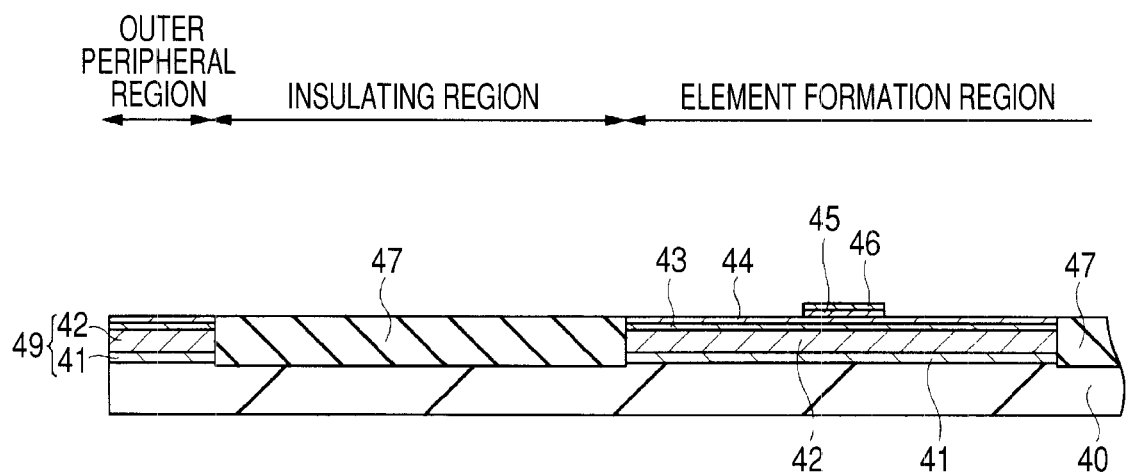
FIG. 16 is a cross-sectional view showing the process steps of manufacturing the semiconductor device subsequent to those shown in to FIG. 15.

Next, as shown in FIG. 16, the isolation region 47 is formed in the insulating region. The isolation region 47 is formed by introducing helium ions into each of the surface of the GaAs substrate 40, the sub-collector semiconductor layer 41, the collector semiconductor layer 42, the base semiconductor layer 43, and the emitter semiconductor layer 44, each formed in the insulating region. Specifically, helium ions are implanted in about five steps by varying an implantation energy and a dose to vary an implantation depth. For example, a first step of ion implantation is performed with an implantation energy of 420 keV and a dose of $2.8 \times 10^{13}/cm^2$, and a second step of ion implantation is performed with an implantation energy of 300 keV and a dose of $1.4 \times 10^{13}/cm^2$. Further, a third step of ion implantation is performed with an implantation energy of 200 keV and a dose of $2.0 \times 10^{13}/cm^2$, and a fourth step of ion implantation is performed with an implantation energy of 100 keV and a dose of $2.0 \times 10^{13}/cm^2$. Finally, a fifth step of ion implantation is performed with an implantation energy of 20 keV and a dose of $2.4 \times 10^{13}/cm^2$. The isolation region 47 is formed in the insulating region, but is not formed in the outer peripheral region of the chip region. That is, in the outer peripheral region of the chip region, the sub-collector semiconductor layer 41, the collector semiconductor layer 42, the base semiconductor layer 43, and the emitter semiconductor layer 44 invariably remain formed.

Although helium has been introduced to form the isolation region 47 in the first embodiment, the element to be introduced is not limited to helium. That is, since the isolation region 47 can be formed by introducing a non-metal element into a semiconductor layer, any non-metal element may be introduced into the semiconductor layer. To form the isolation region 47, it is particularly preferred that the element is introduced deep into the semiconductor layers. Accordingly, hydrogen (H), helium (He), boron (B), or the like can be used as the non-metal element. Of these light elements, helium is preferably used in terms of its reduced tendency to affect the reliability of the elements.

Figure 17:
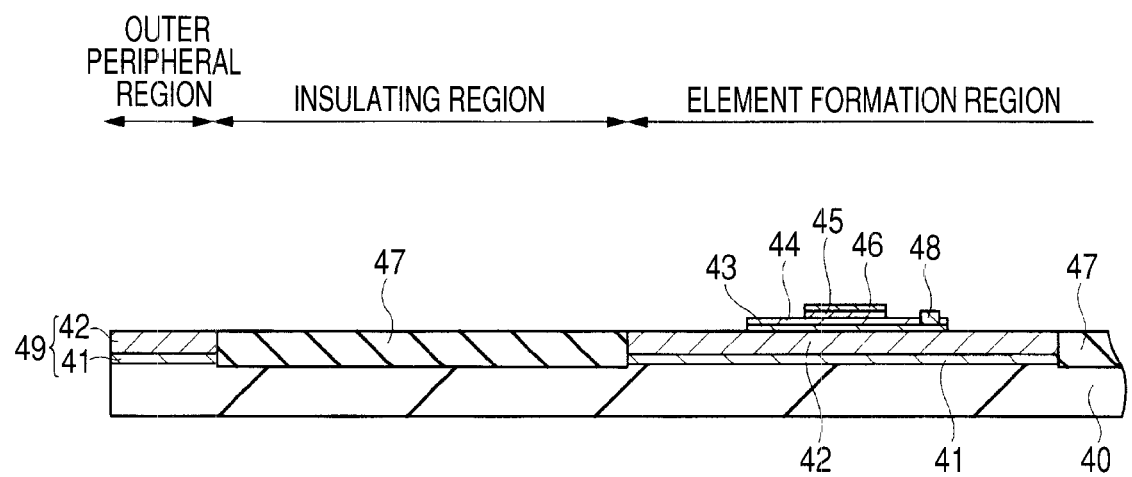
FIG. 17 is a cross-sectional view showing the process steps of manufacturing the semiconductor device subsequent to those shown in FIG. 16.

Subsequently, as shown in FIG. 17, an opening reaching the base semiconductor layer 43 is formed in the element formation region, and a Mo/Au/Pt/Ti/Pt film is formed to fill the opening. Then, by using a photolithographic technique and an etching technique, the Mo/Au/Pt/Ti/Pt film, the emitter semiconductor layer 44, and the base semiconductor layer 43 are patterned. In this manner, the base electrode composed of the Mo/Au/Pt/Ti/Pt film can be formed on the base semiconductor layer 43. At this time, in the insulating region, the emitter semiconductor layer 44 and the base semiconductor layer 43 each forming part of the isolation region 47 and having an insulating property resulting from the introduction of helium are also removed. Likewise, in the outer peripheral region also, the emitter semiconductor layer 44 and the base semiconductor layer 43 are removed. As a result, in the insulating region, the isolation region 47 is formed of the same layers as the sub-collector semiconductor layer 41 and the collector semiconductor layer 42 which are formed in the element formation region, while the conductive layer 49 composed of the sub-collector semiconductor layer 41 and the collector semiconductor layer 42 is formed in the outer peripheral region.

In the first embodiment, since the conductive layer 49 formed in the outer peripheral portion of the chip region is formed of the sub-collector semiconductor layer 41 and the collector semiconductor layer 42, the conductive layer 49 can be formed without adding a new step for forming the conductive layer 49. This allows the conductive layer 49 to be formed without complicating the manufacturing process steps. That is, in contrast to the conventional embodiment in which the isolation region 47 has been formed by implanting helium ions also into the outer peripheral region, the first embodiment forms the conductive layer 49 in the outer peripheral region so that helium has not been introduced into the sub-collector semiconductor layer 41 and the collector semiconductor layer 42 which are formed in the outer peripheral region. As a result, when the isolation region 47 is formed, the conductive layer 49 can be formed in the outer peripheral region of the chip region by merely changing a mask used in the step of implanting helium ions.

Figure 18:
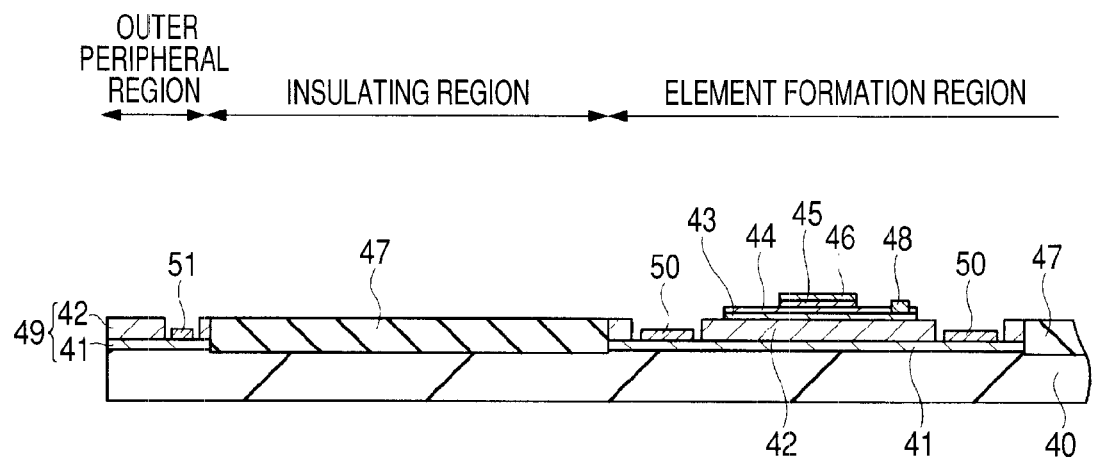
FIG. 18 is a cross-sectional view showing the process steps of manufacturing the semiconductor device subsequent to those shown in FIG. 17.

Next, as shown in FIG. 18, the trenches (first trench) are formed in the collector semiconductor layer 42 in the element formation region by using a photolithographic technique and an etching technique. In the same step, the trench (second trench) is also formed in the collector semiconductor layer 42 in the outer peripheral region. Thereafter, an Au/Ni/AuGe film is formed on the GaAs substrate 40. Then, by using a photolithographic technique and an etching technique, the Au/Ni/AuGe film is patterned to form the collector electrodes 50 and the ohmic electrode 51. Thus, since the ohmic electrode 51 coupled to the conductive layer 49 in the outer peripheral region can be formed in the same step as the collector electrodes 50, the manufacturing process steps can be simplified. The ohmic electrode 51 is formed to implement ohmic contact between the conductive layer 49 and the metal wires formed in the subsequent step.

Figure 19:
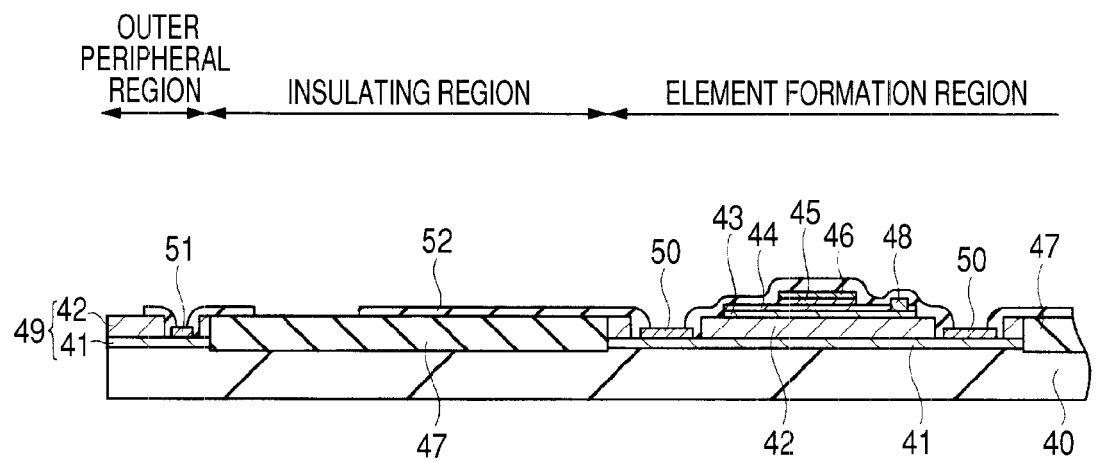
FIG. 19 is a cross-sectional view showing the process steps of manufacturing the semiconductor device subsequent to those shown in FIG. 18.

Subsequently, as shown in FIG. 19, the protective film 52 is formed on the GaAs substrate 40. The protective film 52 is formed of, e.g., a silicon nitride film and can be formed by using a CVD (Chemical Vapor Deposition) method. Then, by using a photolithographic technique and an etching technique, the protective film 52 is patterned. The patterning of the protective film 52 is performed to expose the upper surfaces of the collector electrodes 50, the upper surface of part of the isolation region 47, and the upper surface of the ohmic electrode 51. The protective film 52 is further processed such that the conductive layer 49 formed in the outer peripheral region is partly exposed. This is for removing the protective film 52 to allow easy dicing when the conductive layer 49 composed of the semiconductor layers and the GaAs substrate 40 are cut along the dicing lines present in the outer peripheral region. That is, the protective film 52 is removed in consideration of the fact that, when dicing is performed by, e.g., cleaving the conductive layer 49 and the GaAs substrate 40, the dicing becomes difficult if the protective film 52 remains formed.

Figure 20:
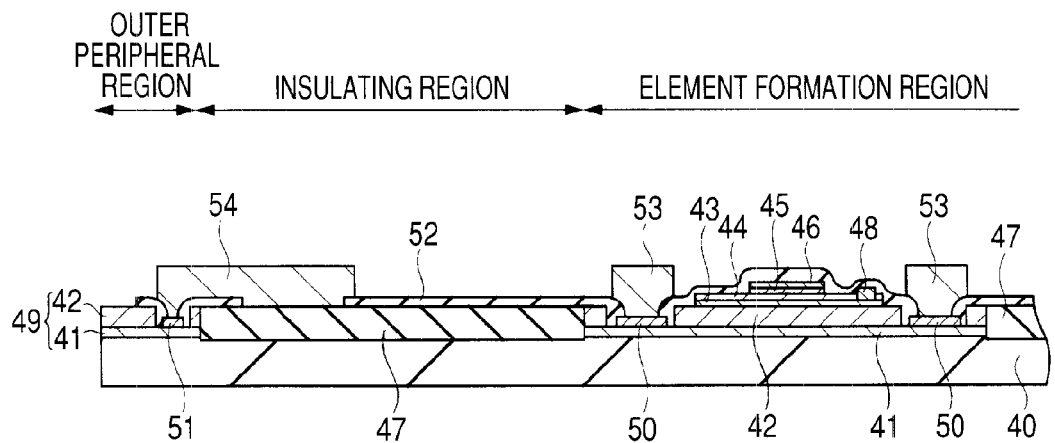
FIG. 20 is a cross-sectional view showing the process steps of manufacturing the semiconductor device subsequent to those shown in FIG. 19.

Next, as shown in FIG. 20, a Pt/Au/Ti film is formed on the GaAs substrate 40. Then, by using a photolithographic technique and an etching technique, the Pt/Au/Ti film is patterned. In this manner, the collector wires 53 to be electrically coupled to the collector electrodes 50 can be formed. Further, in the same step, the wire 54 coupling to the ohmic electrode 51 and provided extensively in the insulating region is also formed. Because the wire 54 can also be formed in the same step as the collector wire 53, the complication of the manufacturing process steps can be suppressed. It is to be noted that the base wire coupling to the base electrode 48 is also formed, though it is not shown in FIG. 20.

Figure 21:
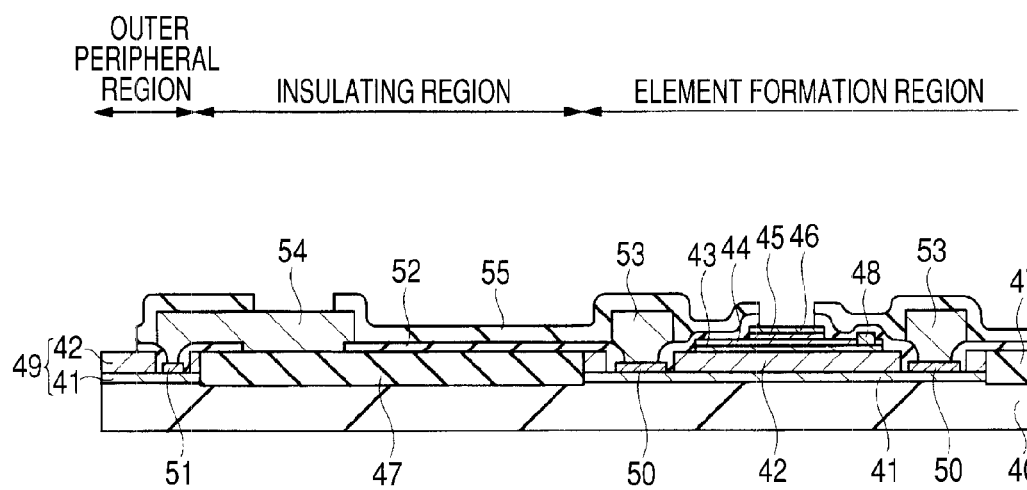
FIG. 21 is a cross-sectional view showing the process steps of manufacturing the semiconductor device subsequent to those shown in FIG. 20.

Subsequently, as shown in FIG. 21, the protective film 55 is formed on the GaAs substrate 40. The protective film 55 is formed of, e.g., a silicon nitride film and can be formed by using a CVD method. Then, by using a photolithographic technology and an etching technology, the protective film 55 is patterned. The patterning of the protective film 55 is performed to expose the upper surface of the emitter electrode 46 and the upper surface of the wire 54. Further, the protective film 55 is processed such that the conductive layer 49 formed in the outer peripheral region is partly exposed.

Figure 22:
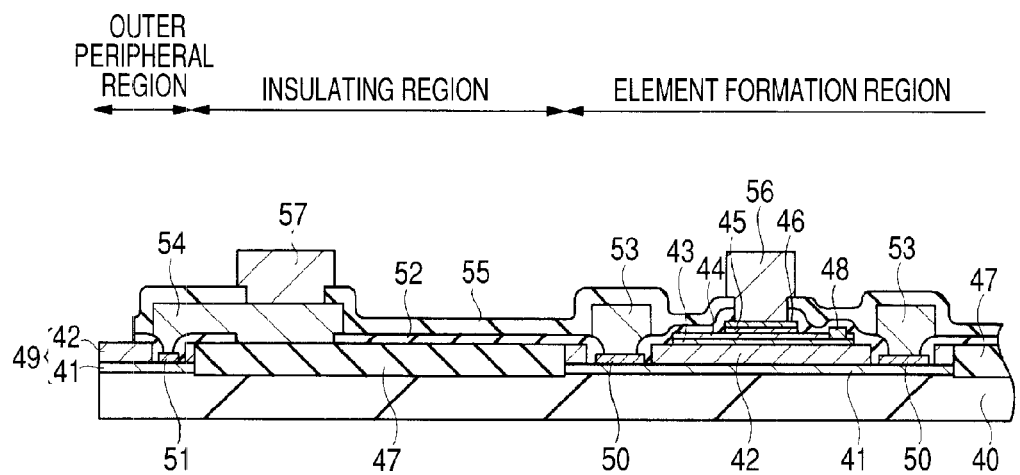
FIG. 22 is a cross-sectional view showing the process steps of manufacturing the semiconductor device subsequent to those shown in FIG. 21.

Next, as shown in FIG. 22, an Au/Ti film is formed on the GaAs substrate 40. Then, by using a photolithographic technology and an etching technology, the Au/Ti film is patterned. In this manner, the emitter wire 56 electrically coupling to an emitter electrode 46 can be formed. Further, in the same step, the pad 57 electrically coupling to the wire 54 is formed.

Since the pad 57 can also be formed in the same step as the emitter wire 56, the complication of the manufacturing process steps can be suppressed.

Figure 23:
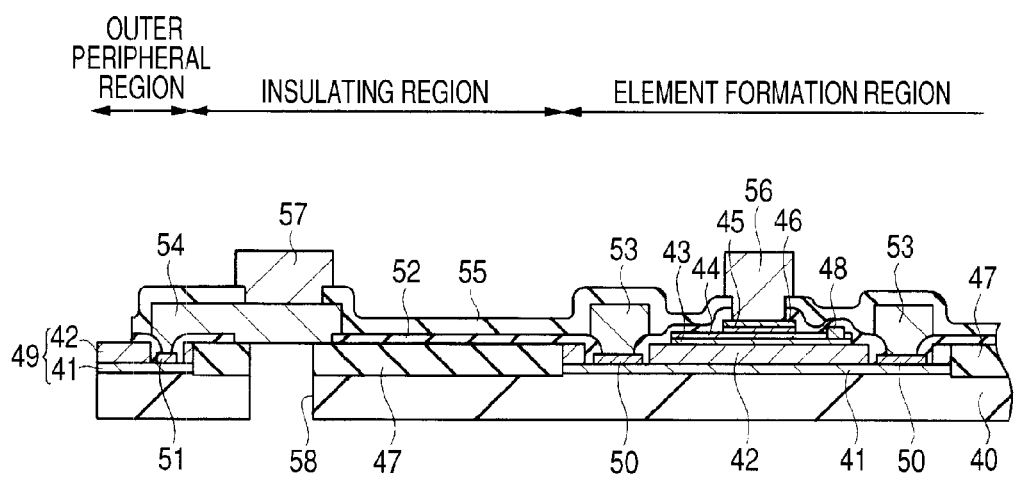
FIG. 23 is a cross-sectional view showing the process steps of manufacturing the semiconductor device subsequent to those shown in FIG. 22.
Figure 24:
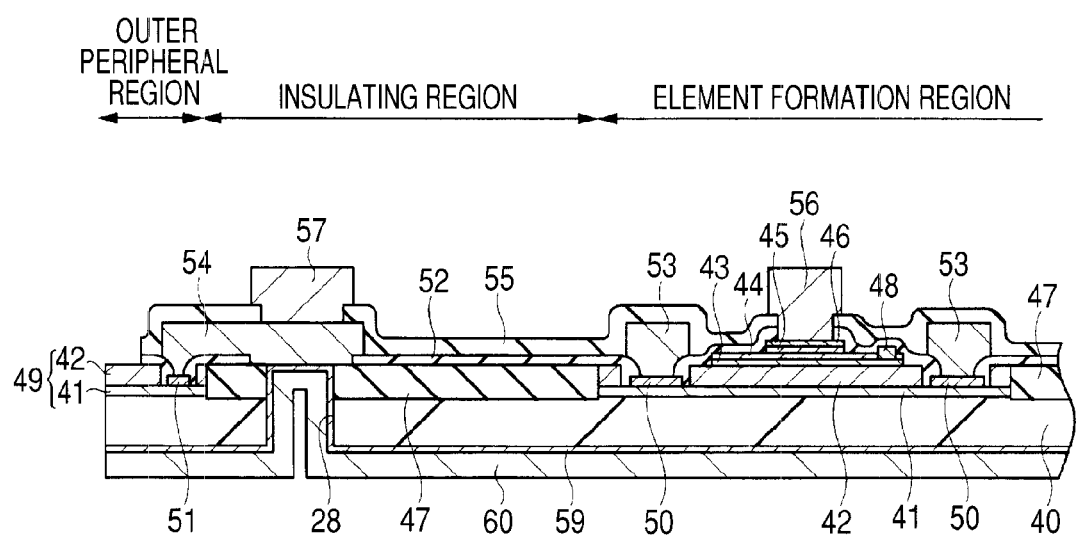
FIG. 24 is a cross-sectional view showing the process steps of manufacturing the semiconductor device subsequent to those shown in FIG. 23.

Subsequently, as shown in FIG. 23, a via hole 58 is formed in the back surface of the GaAs substrate 40 by using a photolithographic technique and an etching technique. The via hole 58 is formed to extend through the GaAs substrate 40 and the isolation region 47 and reach the wire 54. Then, as shown in FIG. 24, a seed electrode 59 is formed on the GaAs substrate 40 including the inside of the via hole 58, and an Au/Ni film 60 is formed on the seed electrode 59. The Au/Ni film 60 can be formed by using, e.g., a plating method and the back surface electrode is formed of the seed electrode 59 and the Au/Ni film 60. In the via hole 58 also, the via is formed of the seed electrode 59 and the Au/Ni film 60 which are buried in the via hole 58. As a result, the back surface electrode and the conductive layer 49 are electrically coupled. Thereafter, a wafer composed of the GaAs substrate 40 is diced on a per chip-region basis to provide the individual semiconductor chips. Each of the semiconductor chips is mounted on the wiring board so that the RF module is manufactured. At this time, since the GND potential is supplied to the back surface electrode formed on the semiconductor chip, the potential of the conductive layer 49 electrically coupled to the back surface electrode is fixed to the GND potential. As a result, the degeneration of the conductive layer 49 exposed in the outer peripheral region of the semiconductor chip is suppressed in the moisture resistance test and the entrance of an impurity into the semiconductor chip can be prevented. In this manner, the semiconductor device according to the first embodiment can be manufactured.

Second Embodiment

In the first embodiment shown above, the example has been described in which the conductive layer formed in the outer peripheral region of the semiconductor chip is electrically coupled to the back surface electrode formed on the back surface of the semiconductor chip via the via such that the potential of the conductive layer is set to the GND potential. In the second embodiment, a description will be given to another example of the structure in which the conductive layer formed in the outer peripheral region is set at the GND potential.

Figure 25:
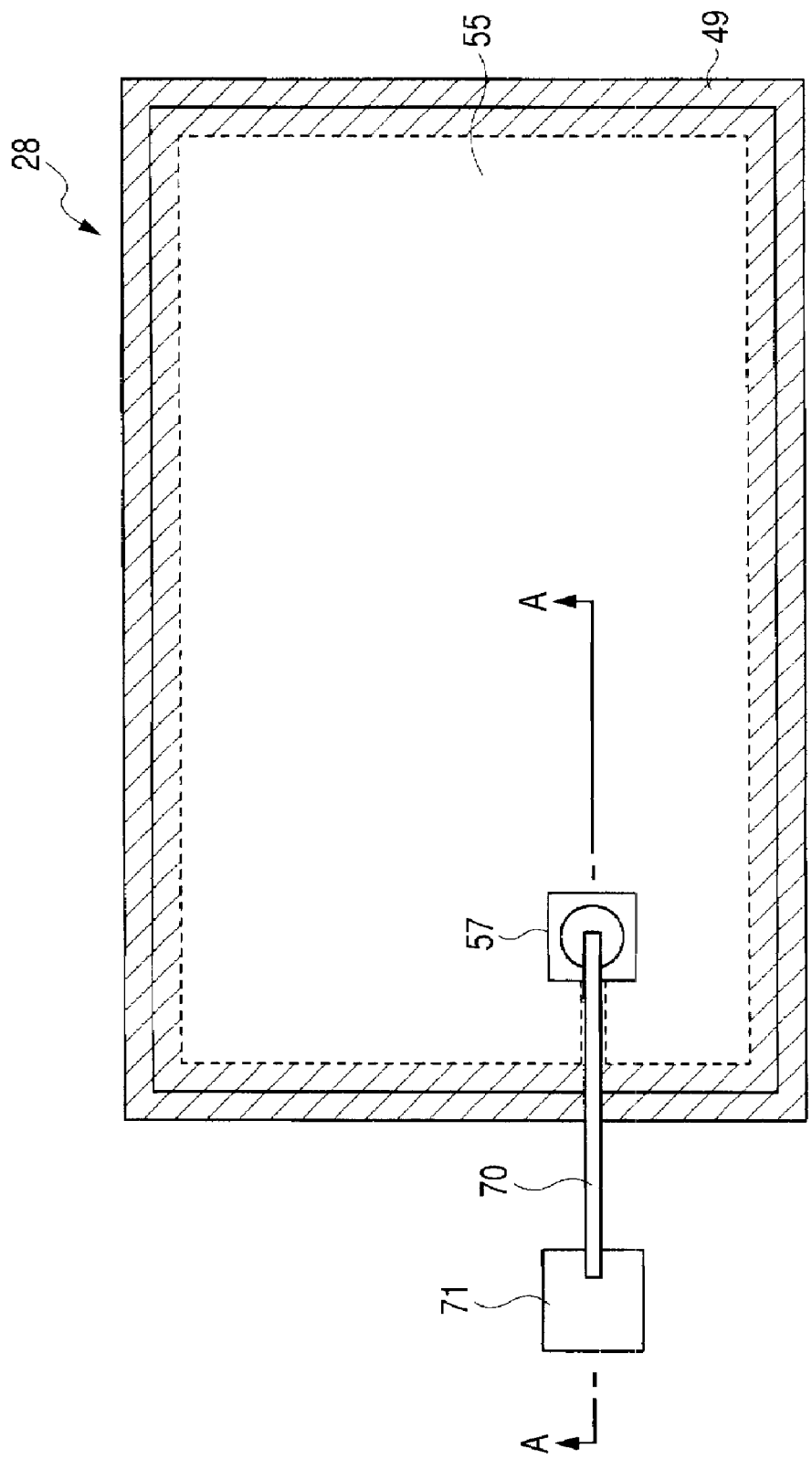
FIG. 25 is a schematic diagram showing a characteristic feature of a second embodiment of the present invention.

FIG. 25 is a top view of the semiconductor chip 28 in the second embodiment of the present invention. In FIG. 25, a layout pattern formed in the semiconductor chip 28 is omitted and the conductive layer 49 formed to surround the outer peripheral region is shown. Briefly, in the outer peripheral region, the conductive layer 49 is partly exposed from the protective film 55. The conductive layer 49 is coupled to the pad 57. So far, the structure of the second embodiment has been the same as that of the first embodiment. The structure of the second embodiment is different from that of the first embodiment in that the pad 57 is coupled to a terminal 71 formed on the wiring board. Because the GND potential is supplied to the terminal 71 formed on the wiring board, the potential of the conductive layer 49 coupled via the wire 70 is also the GND potential. Thus, in the structure of the second embodiment, the back surface electrode of the semiconductor chip 28 and the conductive layer 49 are not coupled, unlike in the first embodiment. Instead, the pad 57 coupled to the conductive layer 49 and the terminal 71 of the wiring board are coupled with the wire to set the potential of the conductive layer 49 to the GND potential.

Figure 26:
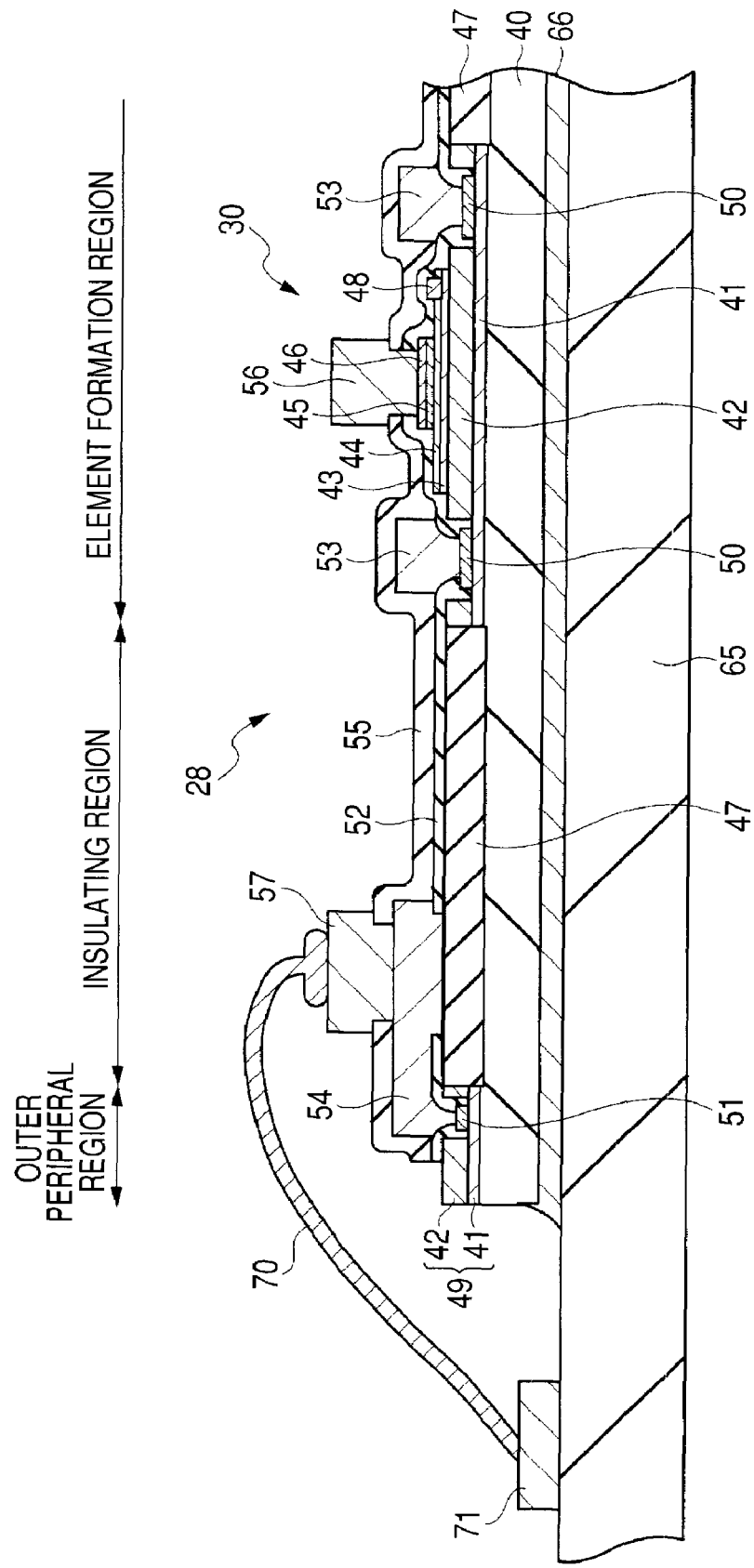
FIG. 26 is a cross-sectional view showing a cross section taken along the line A-A of FIG. 25.

FIG. 26 is a cross-sectional view taken along the line A-A of FIG. 25. As shown in FIG. 26, the semiconductor chip 28 is bonded to a wiring board 65 with the silver paste 66. In the outer peripheral portion of the semiconductor chip 28, the conductive layer 49 is formed and coupled to the wire 54 via the ohmic electrode 51. On the wire 54, the pad 57 is formed. So far, the structure of the second embodiment has been the same as that of the first embodiment. The second embodiment is different from the first embodiment in that the back surface electrode is not formed on the back surface of the semiconductor chip 28. Instead, the pad 57 is coupled to the terminal 71 on the wiring board 65 via the wire 70. Since the terminal 71 is set at the GND potential, the conductive layer 49 is fixed to the GND potential. The structure is manufactured as follows. That is, after the GaAs substrate in a wafer state is divided into the individual separate semiconductor chips 28, each of the separate semiconductor chips 28 is mounted on the wiring board (mounting board). Thereafter, the pad 57 formed on the semiconductor chip 28 and the terminal 71 formed on the wiring board are coupled with the wire 70. In this manner, the conductive layer 49 can be coupled to the terminal 71 using the wire.

By thus coupling the conductive layer 49 to the terminal 71 of the wiring board 65 via the wire 70, it is also possible to set the potential of the conductive layer 49 to the GND potential. The second embodiment is different from the first embodiment described above in the structure for setting the potential of the conductive layer 49 to the GND potential, but is the same as the first embodiment described above in that the potential of the conductive layer 49 is set to the GND potential. Accordingly, in the second embodiment also, the moisture resistance can be improved in the same manner as in the first embodiment.

Although the invention achieved by the present inventors has thus been described specifically based on the embodiments thereof, the present invention is not limited thereto. It will be understood that various changes and modifications can be made in the invention without departing from the gist thereof.

In each of the first and second embodiments, the example has been described above in which the HBTs are formed on the compound semiconductor substrate (semi-insulating substrate). However, the present invention is also applicable to the case where an element such as a HEMT (High Electron Mobility Transistor) is formed on the compound semiconductor substrate.

The present invention is widely applicable to a manufacturing industry for manufacturing a semiconductor device.

What is claimed is:

1. A semiconductor device having a semiconductor chip, the semiconductor chip comprising:
    (a) a semi-insulating substrate;
    (b) a plurality of transistors formed in the semi-insulating substrate;
    (c) an isolation region which is an insulating region for isolating the transistors from each other and formed by implanting a non-metal element into a semiconductor layer;
    (d) a conductive layer formed in an outer peripheral portion of the semiconductor chip; and
    (e) a protective film covering the transistors,
    wherein an end portion of the protective film is located over the conductive layer to expose a part of the conductive layer, and
    wherein a potential of the conductive layer is set to a reference potential,
    wherein the conductive layer is formed of the semiconductor layer, and wherein each of the conductive layer and the isolation region is formed of the same semiconductor layer.

2. A semiconductor device according to claim 1, wherein the transistors are bipolar transistors.

3. A semiconductor device according to claim 1, wherein the semiconductor layer is formed by an epitaxial growth method.

4. A semiconductor device having a semiconductor chip, the semiconductor chip comprising:
   (a) a semi-insulating substrate;
   (b) a plurality of transistors formed in the semi-insulating substrate;
   (c) an isolation region which is an insulating region for isolating the transistors from each other and formed by implanting a non-metal element into a semiconductor layer;
   (d) a conductive layer formed in an outer peripheral portion of the semiconductor chip, and
   (e) a protective film covering the transistors,
   wherein an end portion of the protective film is located over the conductive layer to expose a part of the conductive layer, and
   wherein a potential of the conductive layer is set to a reference potential.
   wherein the transistors are bipolar transistors,
   wherein the semiconductor layer is formed over the semi-insulating substrate,
   wherein the semiconductor layer serves as a collector region in a region where the transistors are formed and serves as the conductive layer in the outer peripheral portion of the semiconductor chip, and
   wherein the collector region and the conductive layer are isolated by the isolation region.

5. A semiconductor device according to claim 4, wherein the semi-insulating substrate is a GaAs substrate or an InP substrate.

6. A semiconductor device according to claim 4, wherein the transistors are heterojunction bipolar transistors.

7. A semiconductor device according to claim 4, wherein the conductive layer is exposed from a side surface of the semiconductor chip.

8. A semiconductor device according to claim 4, wherein the conductive layer is formed of the semiconductor layer.

9. A semiconductor device according to claim 4, wherein an n-type impurity is introduced in the semiconductor layer.

10. A semiconductor device according to claim 4, wherein the non-metal element introduced into the isolation region is helium.

11. A semiconductor device according to claim 4,
    wherein a back surface electrode is formed over a surface of the semi-insulating substrate opposite to a principal surface thereof where the conductive layer is formed, and
    wherein the conductive layer is electrically coupled to the back surface electrode.

12. A semiconductor device according to claim 4, wherein the conductive layer and the back surface electrode are electrically coupled via a via extending through the semi-insulating substrate.

13. A semiconductor device according to claim 4,
    wherein the conductive layer is formed of the semiconductor layer,
    wherein the back surface electrode is formed of a metal layer, and
    wherein an ohmic contact portion is formed between the conductive layer and the back surface electrode such that the electrical coupling between the conductive layer and the back surface electrode is provided by ohmic contact.

14. A semiconductor device according to claim 4, wherein each of the conductive layer and the back surface electrode is at a GND potential.

15. A semiconductor device having a semiconductor chip, the semiconductor chip comprising:
    (a) a semi-insulating substrate;
    (b) a plurality of transistors formed in the semi-insulating substrate;
    (c) an isolation region which is an insulating region for isolating the transistors from each other and formed by implanting a non-metal element into a semiconductor layer;
    (d) a conductive layer formed in an outer peripheral portion of the semiconductor chip; and
    (e) a protective film covering the transistors.
    wherein an end portion of the protective film is located over the conductive layer to expose a part of the conductive layer,
    wherein a potential of the conductive layer is set to a reference potential, and
    wherein a bonding pad is formed over a principal surface of the semi-insulating substrate formed with the conductive layer and electrically coupled to the conductive layer.

16. A semiconductor device according to claim 15, comprising:
    a mounting board for mounting the semiconductor chip,
    wherein the bonding pad formed over the semiconductor chip is coupled to a terminal of the mounting board via a wire and coupled to a GND potential.

* * * * *